US012733385B2

(12) United States Patent
Bae et al.

(10) Patent No.: US 12,733,385 B2
(45) Date of Patent: Sep. 8, 2026

(54) DISPLAY DEVICE AND TILING DISPLAY DEVICE

(71) Applicant: Samsung Display Co., Ltd., Yongin-si (KR)

(72) Inventors: Chulmin Bae, Yongin-si (KR); Jihye Han, Yongin-si (KR); Yung Bin Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 329 days.

(21) Appl. No.: 18/450,814

(22) Filed: Aug. 16, 2023

(65) Prior Publication Data

US 2024/0172540 A1 May 23, 2024

(30) Foreign Application Priority Data

Nov. 23, 2022 (KR) ........................ 10-2022-0158317

(51) Int. Cl.
*H10K 59/80* (2023.01)
*G02B 1/115* (2015.01)
(Continued)

(52) U.S. Cl.
CPC ......... *H10K 59/8792* (2023.02); *G02B 1/115* (2013.01); *H10K 59/18* (2023.02); (Continued)

(58) Field of Classification Search
CPC .... H10K 59/8792; H10K 59/38; H10K 59/18; H10K 2102/351; H10K 50/115; G02B 1/115
(Continued)

(56) References Cited

U.S. PATENT DOCUMENTS 10,361,259 B2 7/2019 Choi et al.
11,038,143 B2 6/2021 Moon et al.
(Continued)

FOREIGN PATENT DOCUMENTS

JP 2012 004063 A 1/2012
KR 10-1588050 B1 1/2016
(Continued)

OTHER PUBLICATIONS

Kyoung Woo Park et al., High-performance thin H:SiON OLED encapsulation layer deposited by PECVD at low temperature, The Royal Society of Chemistry Advances, 2019, 9, 58-64, 18 pages.
(Continued)

*Primary Examiner* — James R Greece
*Assistant Examiner* — Hana S Featherly
(74) *Attorney, Agent, or Firm* — Womble Bond Dickinson (US) LLP

(57) ABSTRACT

A display device including a display panel, and an anti-reflection layer on the display panel is provided. The anti-reflection layer includes a plurality of inorganic layers, the plurality of inorganic layers including a plurality of first inorganic layers having a first refractive index, and each including a silicon oxynitride (SiON), and a plurality of second inorganic layers having a second refractive index which is higher than the first refractive index, and each including a silicon oxynitride. Accordingly, it is possible to form an anti-reflection layer structure having low reflectance and high capping properties while being formed through a simple process, so that the display device may have improved durability and visibility.

20 Claims, 10 Drawing Sheets

(51) Int. Cl.

| | |
|---|---|
| ***H10K 50/115*** | (2023.01) |
| ***H10K 59/18*** | (2023.01) |
| ***H10K 59/38*** | (2023.01) |
| ***H10K 102/00*** | (2023.01) |

(52) U.S. Cl.
CPC ........... *H10K 59/38* (2023.02); *H10K 50/115* (2023.02); *H10K 2102/351* (2023.02)

(58) Field of Classification Search
USPC .......................................................... 313/500
See application file for complete search history.

(56) References Cited

U.S. PATENT DOCUMENTS

| | | | | |
|---|---|---|---|---|
| 2017/0369992 | A1 | 12/2017 | Adib et al. | |
| 2018/0047800 | A1* | 2/2018 | Choi | H10K 59/878 |
| 2021/0359274 | A1* | 11/2021 | Kim | H10K 59/8731 |
| 2021/0376292 | A1 | 12/2021 | Choi et al. | |
| 2022/0320471 | A1 | 10/2022 | Lim et al. | |

FOREIGN PATENT DOCUMENTS

| | | | |
|---|---|---|---|
| KR | 10-2016-0039339 | A | 4/2016 |
| KR | 10-2018-0018969 | A | 2/2018 |
| KR | 10-2020-0069421 | A | 6/2020 |
| KR | 2020 0065912 | A | 6/2020 |
| KR | 10-2021-0149964 | A | 12/2021 |
| KR | 2022 0138546 | A | 10/2022 |
| WO | WO 2020 037042 | A1 | 2/2020 |

OTHER PUBLICATIONS

Venu G. Varanasi et al., Role of Hydrogen and Nitrogen on the Surface Chemical Structure of Bioactive Amorphous Silicon Oxynitride Films, The Journal of Physical Chemistry B, Aug. 21, 2017, 121, 38, 8991-9005, 45 pages.

Akihisa Matsuda, Growth mechanism of microcrystalline silicon obtained from reactive plasmas, Thin Solid Films, vol. 337, Is. 1-2, Jan. 11, 1999, pp. 1-6.

International Search Report issued for Application No. PCT/KR2023/018137, mailed Feb. 27, 2024, 10 pages.

* cited by examiner

DISPLAY DEVICE AND TILING DISPLAY DEVICE

CROSS-REFERENCE TO RELATED APPLICATION(S)

This application claims priority to and the benefit of Korean Patent Application No. 10-2022-0158317, filed on Nov. 23, 2022, the entire content of which is herein incorporated by reference.

BACKGROUND

1. Field

Embodiments of the present disclosure relate to a display device and a tiling display device, and for example, to a display device with improved durability and visibility and a tiling display device.

2. Description of the Related Art

Various types of display devices are used to provide image information. Outer surfaces of such display devices are required to have a high surface hardness and impact resistance in order to protect the display devices from the external environment and to have reliability even in repeated use.

In addition, when a display device is exposed to external light such as various types of lighting and natural light, due to reflected light, an image created inside the display device may not be clearly delivered to a user, or the user may experience an eye fatigue or a headache. For this reason, the demand for anti-reflection is also becoming very strong.

SUMMARY

Aspects of one or more embodiments of the present disclosure are directed toward a display device with an anti-reflection effect.

Aspects of one or more embodiments of the present disclosure are directed toward a tiling display device having low reflection properties, and having improved visibility by including a unit display device with reduced tolerance caused by an anti-reflection structure.

One or more embodiments of the present disclosure provide a display device including a display panel, and an anti-reflection layer on the display panel. The anti-reflection layer includes a plurality of inorganic layers, wherein the plurality of inorganic layers include a plurality of first inorganic layers having a first refractive index, and each including a silicon oxynitride (SiON), and a plurality of second inorganic layers having a second refractive index which is higher than the first refractive index, and each including a silicon oxynitride. Accordingly, it is possible to form an anti-reflection layer structure having low reflectance and high capping properties while being formed through a simple process, so that the display device may have improved durability and visibility.

In one or more embodiments, the first refractive index may be about 1.50 to about 1.70 at a wavelength of about 550 nm, and the second refractive index may be about 1.70 to about 1.90 at a wavelength of about 550 nm.

In one or more embodiments, the plurality of first inorganic layers and the plurality of second inorganic layers may be alternately stacked.

In one or more embodiments, the plurality of first inorganic layers may include a 1-1 inorganic layer and a 1-2 inorganic layer, and the plurality of second inorganic layers may include a 2-1 inorganic layer and a 2-2 inorganic layer, wherein the 1-1 inorganic layer, the 2-1 inorganic layer, the 1-2 inorganic layer, and the 2-2 inorganic layer may be sequentially stacked.

In one or more embodiments, a thickness of each of the plurality of first inorganic layers and the plurality of second inorganic layers may be about 10 nm to about 150 nm.

In one or more embodiments, when a content (e.g., amount) of oxygen with respect to the total content (e.g., amount) of elements in the plurality of first inorganic layers (e.g., each of the plurality of first inorganic layers) is defined as a first oxygen content (e.g., amount), and a content (e.g., amount) of oxygen with respect to the total content (e.g., amount) of elements in the plurality of second inorganic layers (e.g., each of the plurality of second inorganic layers) is defined as a second oxygen content (e.g., amount), the first oxygen content (e.g., amount) may be greater than the second oxygen content (e.g., amount).

In one or more embodiments, when a content (e.g., amount) of nitrogen with respect to the total content (e.g., amount) of elements in the plurality of first inorganic layers (e.g., each of the plurality of first inorganic layers) is defined as a first nitrogen content (e.g., amount), and a content (e.g., amount) of nitrogen with respect to the total content (e.g., amount) of elements in the plurality of second inorganic layers (e.g., each of the plurality of second inorganic layers) is defined as a second nitrogen content (e.g., amount), the first nitrogen content (e.g., amount) may be less than the second nitrogen content (e.g., amount).

In one or more embodiments, each of the plurality of first inorganic layers may include about 23 at % to about 26 at % of oxygen, about 31 at % to about 34 at % of nitrogen, and about 41 at % to about 44 at % of silicon with respect to the total content (e.g., amount) of each of the plurality of first inorganic layers, and each of the plurality of second inorganic layers may include about 20 at % to about 23 at % of oxygen, about 35 at % to about 38 at % of nitrogen, and about 39 at % to about 42 at % of silicon with respect to the total content (e.g., amount) of each of the plurality of second inorganic layers.

In one or more embodiments, the display device may further include an optical layer between the display panel and the anti-reflection layer. In one or more embodiments, the optical layer may include a light control layer on the display panel, and a color filter layer between the light control layer and the anti-reflection layer.

In one or more embodiments, the display panel may include a plurality of light emitting elements generating a first light, wherein the light control layer may include a first light control unit configured to transmit the first light, a second light control unit configured to convert the first light into a second light having a different wavelength from the first light, and a third light control unit configured to convert the first light into a third light having a different wavelength from the first light and the second light.

In one or more embodiments, the optical layer may further include an overcoat layer on the color filter layer, wherein the anti-reflection layer may be in contact with an upper surface of the overcoat layer.

In one or more embodiments, a refractive index of the overcoat layer may be about 1.45 to about 1.53, and the thickness of the overcoat layer may be about 3 μm to about 10 μm.

In one or more embodiments, the anti-reflection layer may further include a low refractive layer on the plurality of inorganic layers, wherein an upper surface of the low refractive layer may define the outermost periphery surface of the anti-reflection layer.

In one or more embodiments, a refractive index of the low refraction layer may be about 1.3 to less than about 1.5.

In one or more embodiments, the reflectance on an upper surface of the anti-reflection layer may be about 2% or less.

In one or more embodiments of the present disclosure, a display device includes a display panel, and an anti-reflection layer on the display panel, the anti-reflection layer including a plurality of inorganic layers, wherein the plurality of inorganic layers include a plurality of first inorganic layers, each including a silicon oxynitride (SiON), and a plurality of second inorganic layers, each including a silicon oxynitride, wherein when a content (e.g., amount) of oxygen with respect to the total content (e.g., amount) of elements in the plurality of first inorganic layers (e.g., each of the plurality of first inorganic layers) is defined as a first oxygen content (e.g., amount), and a content (e.g., amount) of oxygen with respect to the total content (e.g., amount) of elements in the plurality of second inorganic layers (e.g., each of the plurality of second inorganic layers) is defined as a second oxygen content (e.g., amount), the first oxygen content (e.g., amount) is greater than the second oxygen content (e.g., amount).

In one or more embodiments, when a content (e.g., amount) of nitrogen with respect to the total content (e.g., amount) of elements in the plurality of first inorganic layers (e.g., each of the plurality of first inorganic layers) is defined as a first nitrogen content (e.g., amount), and a content (e.g., amount) of nitrogen with respect to the total content (e.g., amount) of elements in the plurality of second inorganic layers (e.g., each of the plurality of second inorganic layers) is defined as a second nitrogen content (e.g., amount), the first nitrogen content (e.g., amount) may be less than the second nitrogen content (e.g., amount).

In one or more embodiments, the display device may further include an optical layer between the display panel and the anti-reflection layer. In one or more embodiments, the optical layer may include a light control layer on the display panel, a color filter layer between the light control layer and the anti-reflection layer, and an overcoat layer on the color filter layer, wherein the anti-reflection layer may be directly on the overcoat layer.

In one or more embodiments of the present disclosure, a tiling display device includes a plurality of unit display devices along at least one direction. In one or more embodiments, each of the plurality of unit display devices may include a display panel, and an anti-reflection layer on the display panel, the anti-reflection layer including a plurality of inorganic layers, wherein the plurality of inorganic layers include a first inorganic layer having a first refractive index, and include a silicon oxynitride (SiON), and a second inorganic layer being in contact with any one of an upper surface or a lower surface of the first inorganic layer, and having a second refractive index which is higher than the first refractive index, and including a silicon oxynitride.

In one or more embodiments, a side surface of the anti-reflection layer and a side surface of the display panel may define one aligned side surface.

BRIEF DESCRIPTION OF THE DRAWINGS

The accompanying drawings are included to provide a further understanding of the present disclosure, and are incorporated in and constitute a part of the present disclosure. The drawings illustrate embodiments of the present disclosure and, together with the description, serve to explain features, aspects, and/or principles of the present disclosure. In the drawings.

DETAILED DESCRIPTION

Figure 1:
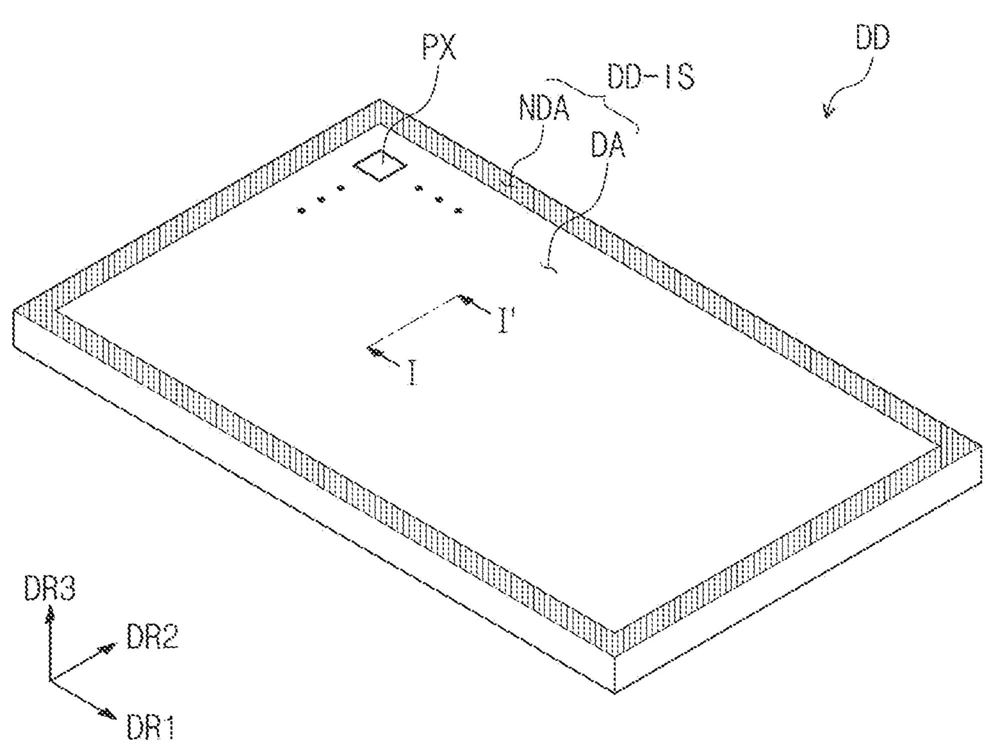
FIG. 1 is a perspective view of a display device according to one or more embodiments of the present disclosure.

The present disclosure may be modified in many alternate forms, and thus specific embodiments will be illustrated in the drawings and described in more detail. It should be understood, however, that this is not intended to limit the present disclosure to the particular forms disclosed, but rather, is intended to cover all modifications, equivalents, and alternatives falling within the spirit and scope of the present disclosure. The embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

In the present disclosure, when an element (or a region, a layer, a portion, etc.) is referred to as being "on," "connected to," or "coupled to" another element, it means that the element may be directly on, connected to, or coupled to the other element, or one or more intervening elements may be present. In addition, it will also be understood that when an element or layer is referred to as being "between" two elements or layers, it can be the only element or layer between the two elements or layers, or one or more intervening elements or layers may also be present.

Unless otherwise noted, like reference numerals denote like elements throughout the attached drawings and the written description, and thus, duplicative descriptions thereof may not be provided. Also, in the drawings, the thickness, the ratio, and the dimensions of elements may be exaggerated for clarity and/or an effective description of the technical content. As used herein, the term "and/or" includes any and all combinations of one or more of the associated listed items.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing from the spirit and scope of the present disclosure. As used herein, the singular forms "a," "an" and "the" are intended to include the plural forms as well, unless the context clearly indicates otherwise.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It should be understood that the terms "comprise," "include," or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the present disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

Expressions such as "at least one of," "a plurality of," "one of," and other prepositional phrases, when preceding a list of elements, should be understood as including the disjunctive if written as a conjunctive list and vice versa. For example, the expressions "at least one of a, b, or c," "at least one of a, b, and/or c," "one selected from the group consisting of a, b, and c," "at least one selected from a, b, and c," "at least one from among a, b, and c," "one from among a, b, and c", "at least one of a to c" indicates only a, only b, only c, both a and b, both a and c, both b and c, all of a, b, and c, or variations thereof.

Unless otherwise defined, all terms (including technical and scientific terms) used herein have the same meaning as commonly understood by one of ordinary skill in the art to which the present disclosure belongs. It is also to be understood that terms, such as those defined in commonly used dictionaries, should be interpreted as having meanings consistent with the meanings in the context of the related art and/or the specification, and should not be interpreted in an idealized or overly formal sense, unless explicitly so defined herein.

Hereinafter, embodiments of the present disclosure will be described with reference to the accompanying drawings.

FIG. 1 is a perspective view of a display device according to one or more embodiments of the present disclosure.

Referring to FIG. 1, a display device DD of one or more embodiments may be a device activated according to an electrical signal. For example, the display device DD may be a large device such as a television, a monitor, or an external advertisement board. In one or more embodiments, the display device DD may be a small or medium-sized device such as a personal computer, a laptop computer, a personal digital terminal, a car navigation system unit, a game console, a smart phone, a tablet, or a camera. In one or more embodiments, it should be understood that these are merely embodiments, and the display device DD may be employed as other electronic devices without departing from the scope of the present disclosure.

The display device DD may display an image (or a moving image) through a display surface DD-IS. The display surface DD-IS may be parallel to a plane defined by a first direction DR1 and a second direction DR2. The display surface DD-IS may include a display region DA and a non-display region NDA.

A pixel PX may be disposed in the display region DA, and the pixel PX may not be disposed in the non-display region NDA. The non-display region NDA may be defined along the edge of the display surface DD-IS. The non-display region NDA may surround the display region DA. However, the present disclosure is not limited thereto, and the non-display region NDA may not be provided, or the non-display region NDA may be disposed on only one or more sides of the display region DA.

FIG. 1 illustrates the display device DD provided with a planar display surface DD-IS, but the present disclosure is not limited thereto. The display device DD may include a curved display surface or a three-dimensional display surface. The three-dimensional display surface may include a plurality of display regions indicating or facing different directions.

The thickness direction of the display device DD may be a direction parallel to the third direction DR3, which is the normal direction with respect to the plane defined by the first direction DR1 and the second direction DR2. Directions indicated by the first to third direction directions DR1, DR2, and DR3 described in the present disclosure are a relative concept, and may be converted into different directions.

In the present disclosure, an upper surface (or a front surface) and a lower surface (or a rear surface) of members constituting the display device DD may be defined with respect to the third direction DR3. More specifically, in one member, a surface relatively adjacent to the display surface DD-IS between two surfaces with respect to the third direction DR3 may be defined as a front surface (or an upper surface), and a surface relatively spaced apart from (separated from) the display surface DD-IS may be defined as a rear surface (or a lower surface). In one or more embodiments, in the present disclosure, an upper portion and a lower portion may be defined based on the third direction DR3, and the upper portion may be defined in a direction getting closer to the display surface DD-IS, and the lower portion may be defined in a direction moving away from the display surface DD-IS.

Figure 2:
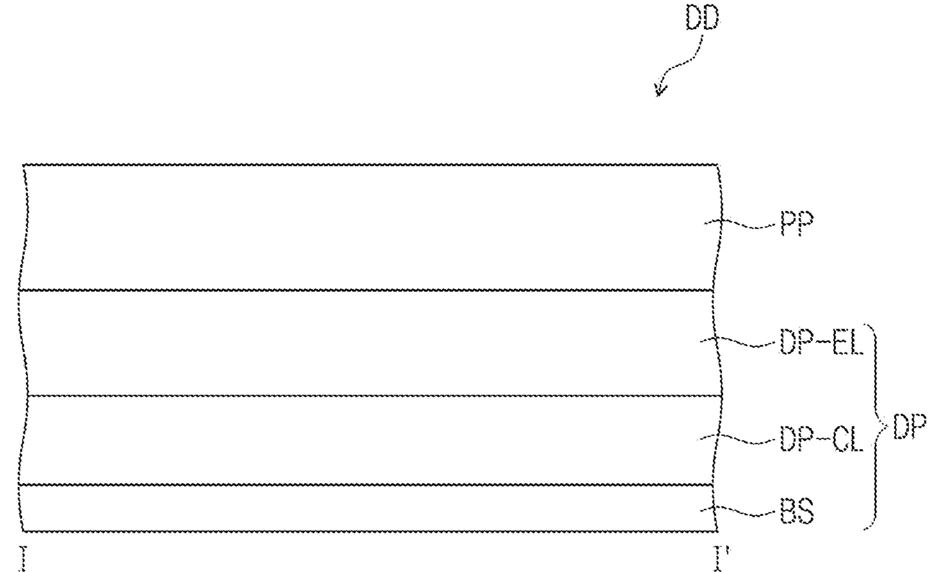
FIG. 2 is a cross-sectional view of a display device taken along line I-I' of FIG. 1, according to one or more embodiments of the present disclosure.

FIG. 2 is a cross-sectional view of a display device according to one or more embodiments of the present disclosure. FIG. 2 is a cross-sectional view of the display device DD according to one or more embodiments, the cross-sectional view taken along line I-I' of FIG. 1.

Referring to FIG. 2, the display device DD may include a display panel DP and an optical structure layer PP disposed on the display panel DP. The display panel DP may include a display element layer DP-EL. The display element layer DP-EL includes a light emitting element ED (see, e.g., FIGS. 4A-4B).

The optical structure layer PP may be disposed on the display panel DP to control reflected light in the display panel DP caused by external light. The optical structure layer PP may include, for example, a color filter layer, and may include an anti-reflection layer. A detailed description of the optical structure layer PP will be described in more detail below.

In the display device DD of one or more embodiments, the display panel DP may be a light emitting-type or kind display panel. For example, the display panel DP may be a light-emitting diode (LED) display panel, an organic electroluminescence display panel, or a quantum-dot light-emitting display panel. However, the present disclosure is not limited thereto. The display panel DP may provide a first light. For example, the display panel DP may emit blue light as a source light.

The light-emitting diode (LED) display panel may include a light emitting diode, and a light emitting layer of the organic electroluminescence display panel may include an organic electroluminescence material, and a light emitting layer of the quantum-dot light-emitting display panel may include a quantum dot, a quantum rod, and/or the like. Hereinafter, the display panel DP included in the display device DD of one or more embodiments is described as an organic electroluminescence display panel. However, the present disclosure is not limited thereto.

The display panel DP may include a base substrate BS, a circuit layer DP-CL disposed on the base substrate BS, and the display element layer DP-EL disposed on the circuit layer DP-CL.

The base substrate BS may be a member which provides a base surface on which the display element layer DP-EL is disposed. The base substrate BS may be a glass substrate, a metal substrate, a plastic substrate, and/or the like. However, the present disclosure is not limited thereto, and the base substrate BS may be an inorganic layer, an organic layer, or a composite material layer. The base substrate BS may be a flexible substrate which may be easily bent or folded.

In one or more embodiments, the circuit layer DP-CL may be disposed on the base substrate BS, and the circuit layer DP-CL may include a plurality of transistors. Each of the transistors may include a control electrode, an input electrode, and/or an output electrode. For example, the circuit layer DP-CL may include a switching transistor and a driving transistor for driving the light emitting element ED (see, e.g., FIG. 4A) of the display element layer DP-EL.

Figure 3:
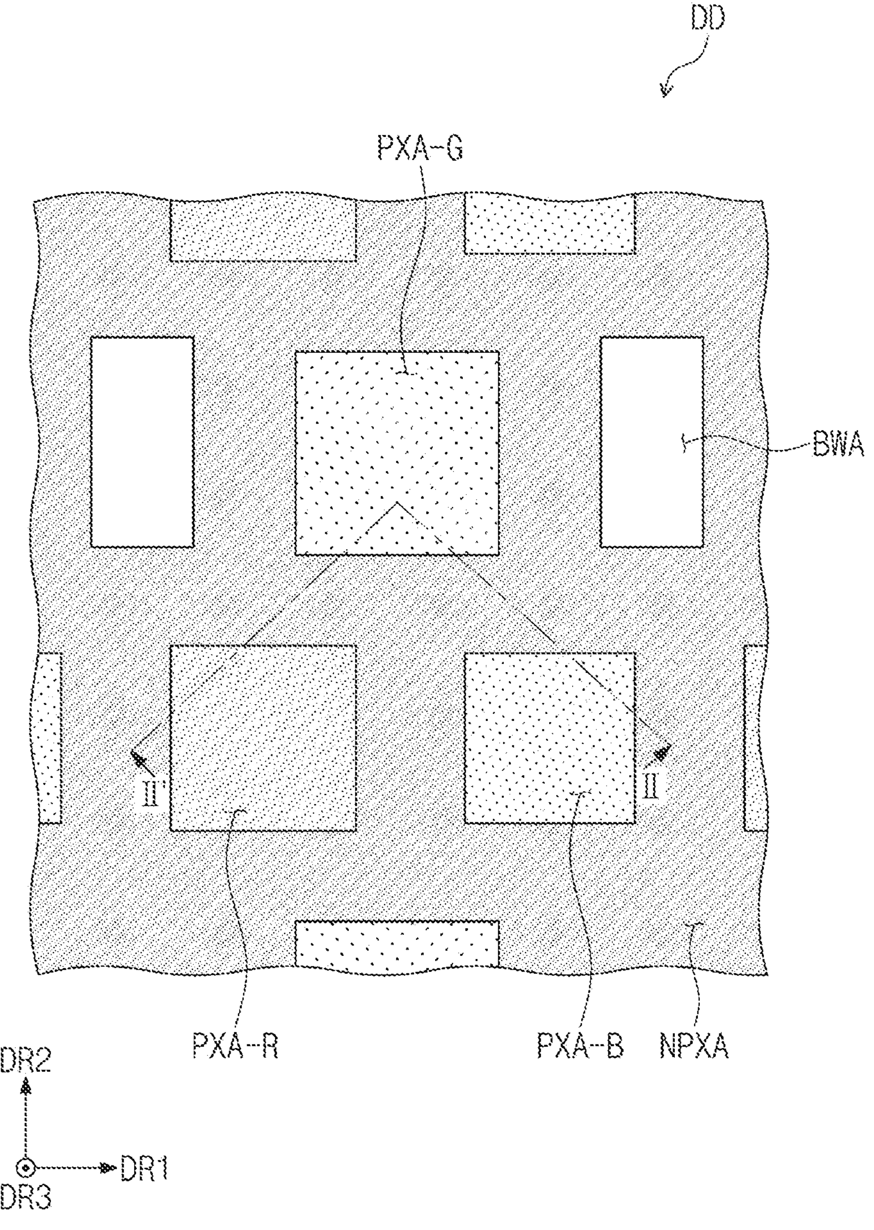
FIG. 3 is a plan view of some regions of a display device according to one or more embodiments of the present disclosure.

FIG. 3 is a plan view of some regions of a display device according to one or more embodiments of the present disclosure.

Referring to FIG. 3, the display device DD of one or more embodiments may include three light-emitting regions PXA-B, PXA-G, and PXA-R, and a plane including a bank well region BWA adjacent thereto. In one or more embodiments of the present disclosure, the three types or kinds of light-emitting regions PXA-B, PXA-G, and PXA-R illustrated in FIG. 3 may be repeatedly disposed throughout the display region DA (see, e.g., FIG. 1).

Around each of a first light-emitting region to a third light-emitting region PXA-B, PXA-G, and PXA-R, a peripheral region NPXA is disposed. The peripheral region NPXA sets boundaries between the first light-emitting region to the third light-emitting region PXA-B, PXA-G, and PXA-R. The peripheral region NPXA may surround the first light-emitting region to the third light-emitting region PXA-B, PXA-G, and PXA-R. In the peripheral region NPXA, a structure for preventing or reducing color mixing between the first light-emitting region to the third light emission region PXA-B, PXA-G, and PXA-R, for example, a pixel definition film PDL (see, e.g., FIG. 4A) and/or the like, may be disposed.

In FIG. 3, the first light-emitting region to the third light-emitting region PXA-B, PXA-G, and PXA-R having the same (or substantially the same) planar shape and different planar areas are illustrated, but the present disclosure is not limited thereto. Two or more of (among) the first light-emitting region to the third light-emitting region PXA-B, PXA-G, and/or PXA-R may have the same (or substantially the same) area as each other. The areas of the first light-emitting region to the third light-emitting region PXA-B, PXA-G, and PXA-R may be set according to the color of emitted light. Among primary colors, the area of a light-emitting region emitting green light may be the largest, and the area of a light-emitting region emitting blue light may be the smallest. However, the present disclosure is not limited what is illustrated in FIG. 3, and the areas of the first light-emitting region to the third light-emitting region PXA-B, PXA-G, and PXA-R may be variously and/or suitably changed.

In FIG. 3, the first light-emitting region to the third light-emitting region PXA-B, PXA-G, and PXA-R having in a rectangular shape are illustrated, but the present disclosure is not limited thereto. On a plane, the first light-emitting region to the third light-emitting region PXA-B, PXA-G, and PXA-R may have a different polygonal shape (including a substantially polygonal shape) such as a rhombic shape or a pentagonal shape. In one or more embodiments, the first light-emitting region to the third light-emitting region PXA-B, PXA-G, and PXA-R may have a rectangular shape (a substantially rectangular shape) having round corner regions on a plane.

FIG. 3 illustrates that the second light-emitting region PXA-G is disposed in a first row and the first light-emitting region PXA-B and the third light-emitting region PXA-R are disposed in a second row, but the present disclosure is not limited thereto, and the disposition of the first light-emitting region to the third light-emitting region PXA-B, PXA-G, and PXA-R may be variously and/or suitably changed. For example, the first light-emitting region to the third light-emitting region PXA-B, PXA-G, and PXA-R may be disposed on the same (or substantially the same) row.

In the display region DA (see, e.g., FIG. 1), the bank well region BWA may be defined. The bank well region BWA may be a region in which a bank well is formed to prevent or reduce defects caused by erroneous adhesion during a process of patterning a plurality of light control units CCP-B, CCP-G, and CCP-R (see, e.g., FIG. 4A) which are included in a light control layer CCL (see, e.g., FIG. 4A). For example, the bank well region BWA may be a region in which a bank well formed by removing a portion of partition wall portions BK (see, e.g., FIG. 4A) is defined.

FIG. 3. illustrates that two bank well regions BWA are defined to be adjacent to the second pixel region PXA-G, but the present disclosure is not limited thereto. The shape and disposition of the bank well region BWA may be variously and/or suitably changed.

Figure 4A:
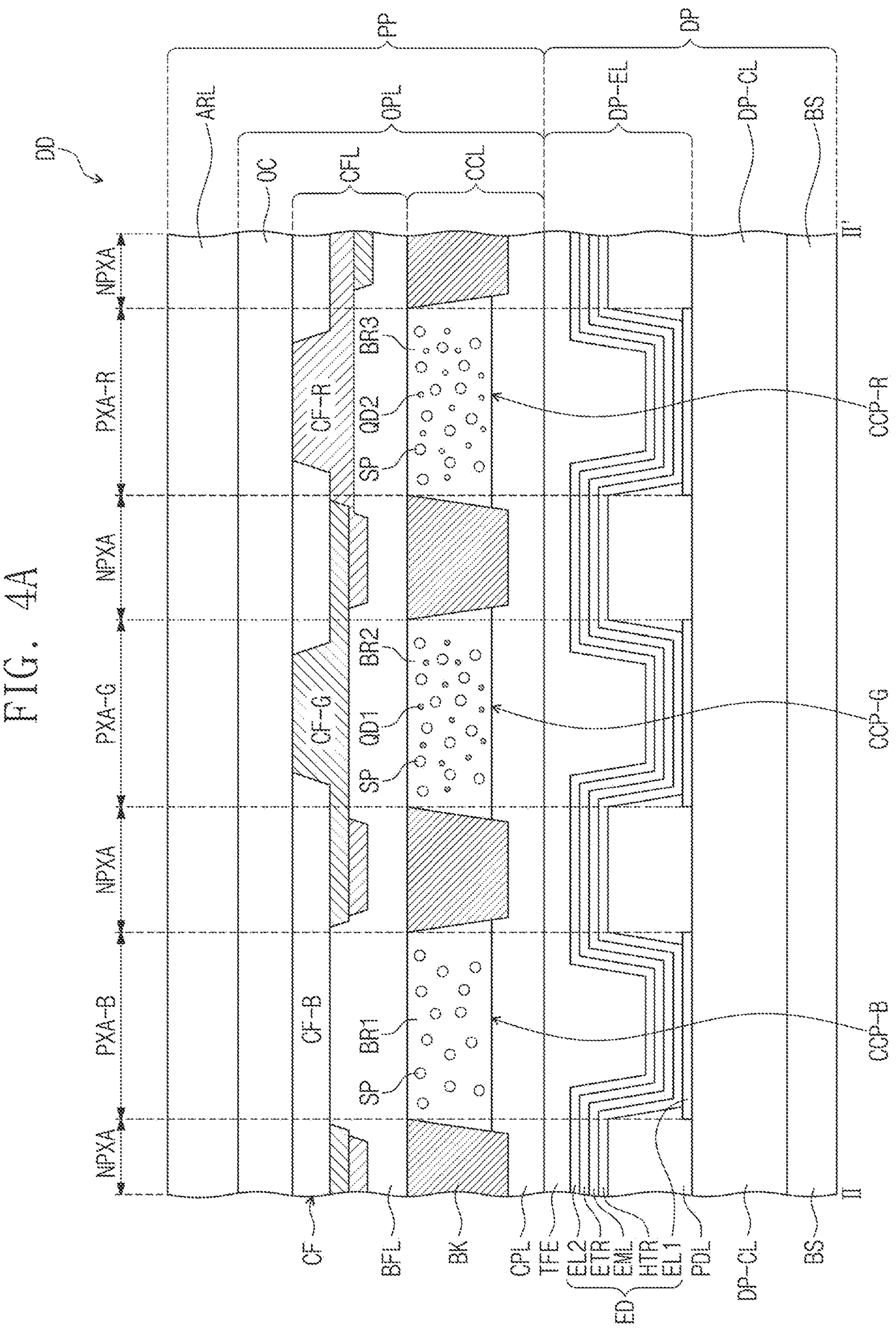
FIGS. 4A-4C are cross-sectional views taken along line II-II' of FIG. 3, according to embodiments of the present disclosure.
Figure 4B:
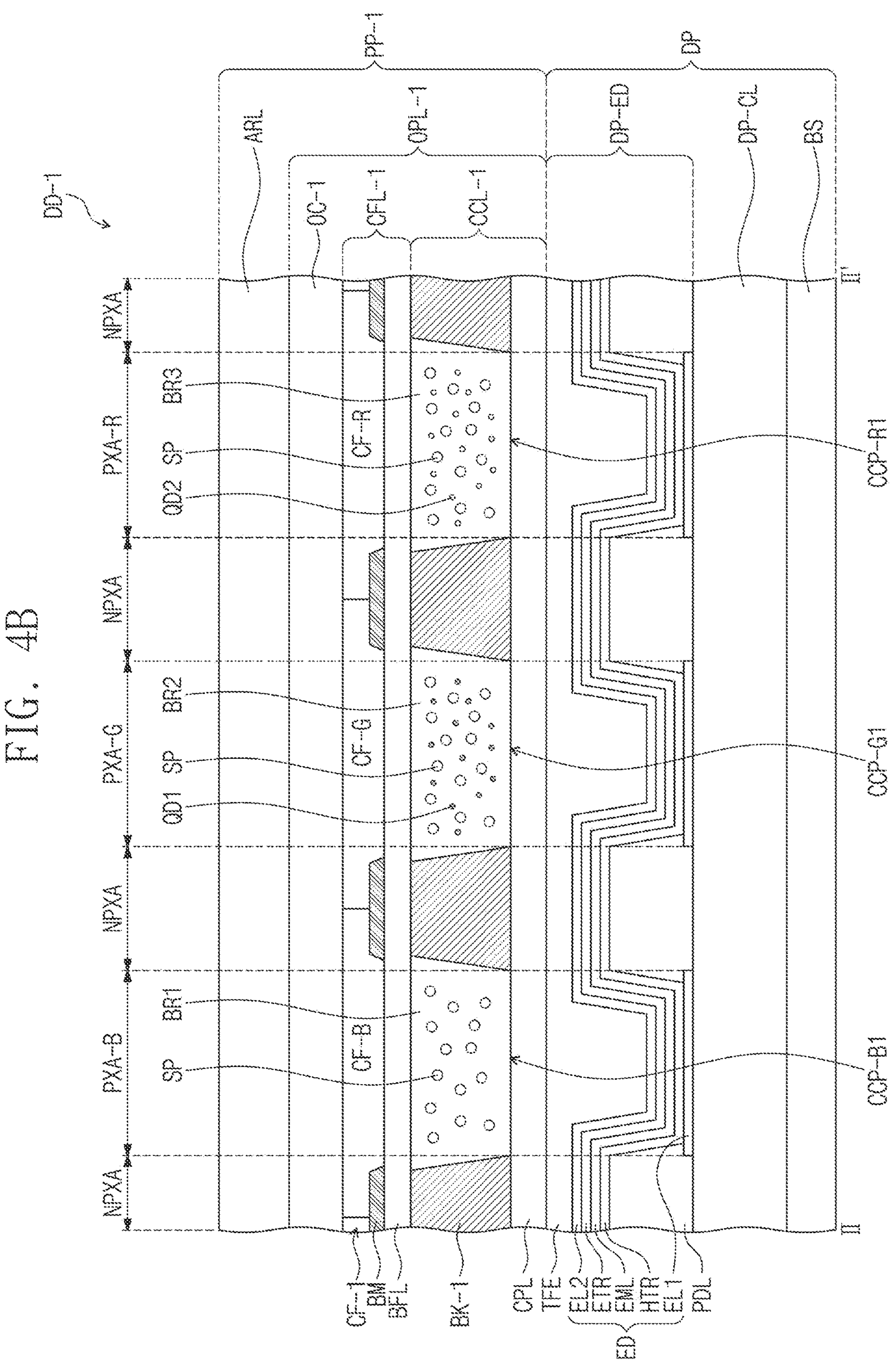
Figure 4C:
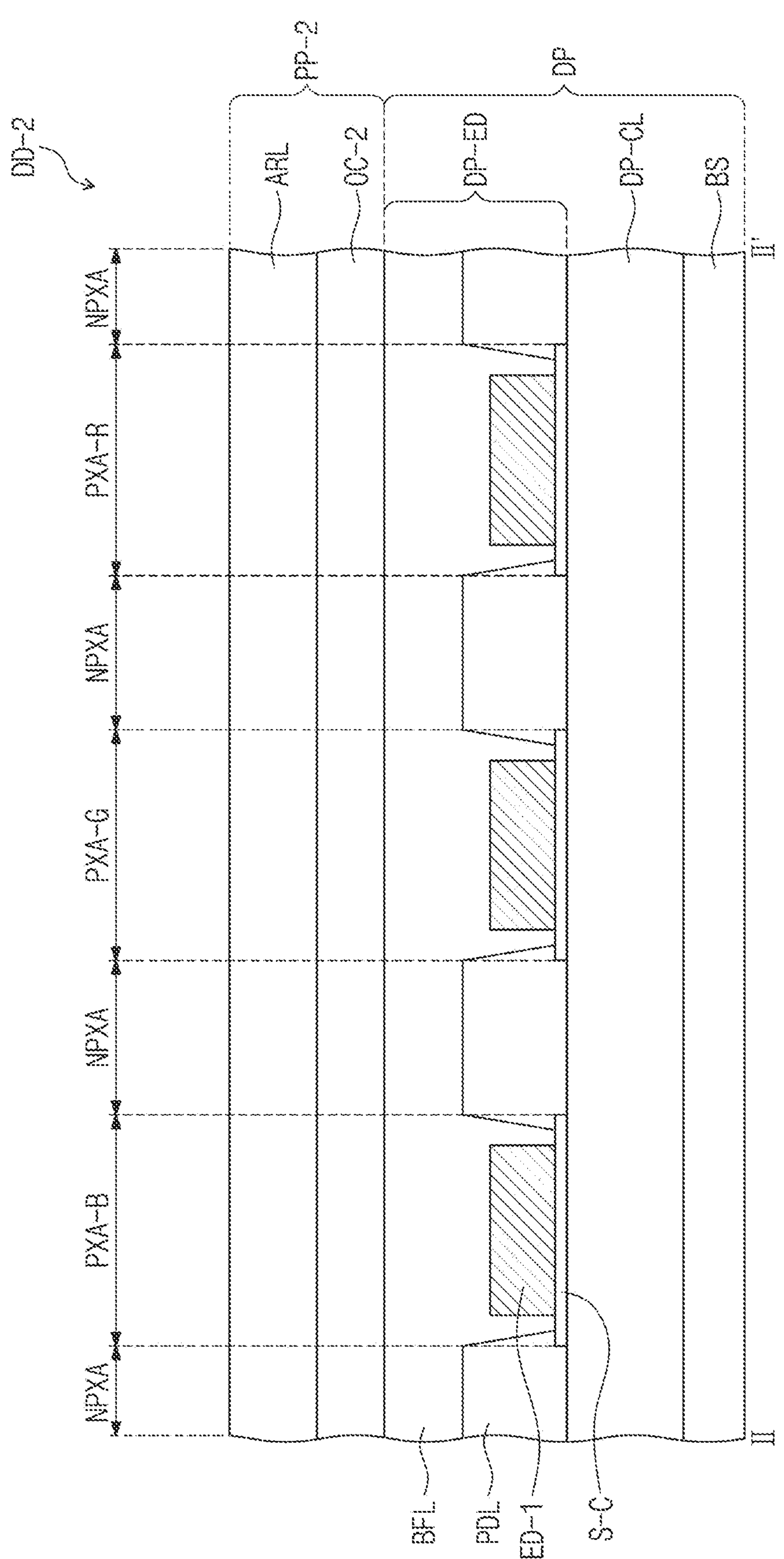

FIG. 4A to FIG. 4C are cross-sectional views of display devices according to embodiments of the present disclosure. FIG. 4A to FIG. 4C illustrate cross-sections taken along line II-II' of FIG. 3.

In the display device DD of one or more embodiments illustrated in FIG. 3, and FIG. 4A to FIG. 4C, three light-emitting regions PXA-B, PXA-G, and PXA-R which respectively emit blue light, green light, and red light are illustrated. For example, display devices DD and DD-1 of one or more embodiments may include a blue light-emitting region PXA-B, a green light-emitting region PXA-G, and a red light-emitting region PXA-R distinguished from each other.

Referring to FIG. 4A to FIG. 4C, display devices DD, DD-1, and DD-2 of one or more embodiments may include a display panel DP including a light emitting element ED, and optical structure layers PP, PP-1, and PP-2 disposed on the display panel DP.

The display panel DP may include the base substrate BS, the circuit layer DP-CL provided on the base substrate BS, and the display element layer DP-EL. The display element layer DP-EL may include the pixel definition film PDL, the light emitting element ED disposed between the pixel definition films PDL or on the pixel definition film PDL, and an encapsulation layer TFE disposed on the light emitting element ED.

The display element layer DP-EL may include the pixel definition film PDL. Each of the light-emitting regions PXA-B, PXA-G, and PXA-R may be a region distinguished by the pixel definition film PDL. The peripheral region NPXA may be regions between adjacent light-emitting regions PXA-B, PXA-G, and PXA-R, and may be regions corresponding to the pixel definition film PDL. For example, in the present disclosure, each of the light-emitting regions PXA-B, PXA-G, and PXA-R may correspond to a pixel. As illustrated in FIG. 4A, an organic layer such as a light emitting layer EML included in the light emitting element ED may be provided as a common layer to overlap all of the light-emitting regions PXA-B, PXA-G, and PXA-R and the peripheral region NPXA. In one or more embodiments, the light emitting layer EML of the light emitting element ED may be distinguished by being disposed in an opening OH defined by the pixel definition film PDL.

The pixel definition film PDL may be formed of a polymer resin. For example, the pixel definition film PDL may be formed by including a polyacrylate-based resin or a polyimide-based resin. Also, the pixel definition film PDL may be formed by further including an inorganic matter in addition to the polymer resin. For example, the pixel definition film PDL may be formed by including a light absorbing material, or may be formed by including a black pigment and/or a black dye. The pixel definition film PDL formed by including a black pigment and/or a black dye may implement a black pixel definition film. When the pixel definition film PDL is formed, carbon black and/or the like may be utilized as a black pigment and/or a black dye, but the present disclosure is not limited thereto.

The pixel definition film PDL may be formed of an inorganic matter. For example, the pixel definition film PDL may be formed by including a silicon nitride ($SiN_x$), a silicon oxide ($SiO_x$), a silicon oxynitride ($SiO_xN_y$), and/or the like. The pixel definition film PDL may define light-emitting regions PXA-B, PXA-G, and PXA-R. The light-emitting regions PXA-B, PXA-G, and PXA-R and the peripheral region NPXA may be distinguished by the pixel definition film PDL.

Referring to FIG. 4A and FIG. 4B, the display element layer DP-EL may include the light emitting element ED, a portion of which is disposed on the pixel definition film PDL. The display device DD of one or more embodiments may include the light emitting element ED, and the light emitting element ED may include the light emitting layer EML. The light emitting element ED according to one or more embodiments includes a first electrode EL1, a second electrode EL2 facing the first electrode EL1, and a plurality of functional layers disposed between the first electrode EL1 and the second electrode EL2 and including the light emitting layer EML.

The plurality of functional layers may include a hole transport region HTR disposed between the first electrode EL1 and the light emitting layer EML, and an electron transport region ETR disposed between the light emitting layer EML and the second electrode EL2. In one or more embodiments, an element capping layer may be further disposed on the second electrode EL2.

The hole transport region HTR and the electron transport region ETR may each include a plurality of sub-functional layers. For example, the hole transport region HTR may include a hole injection layer and a hole transport layer as sub-functional layers, and the electron transport region ETR may include an electron injection layer and an electron transport layer as sub-functional layers. However, the present disclosure is not limited thereto, and the hole transport region HTR may further include an electron blocking layer and/or the like as a sub-functional layer (or layers), and the electron transport region ETR may further include a hole blocking layer and/or the like as a sub-functional layer (or layers).

The first electrode EL1 has conductivity (e.g., is a conductor). The first electrode EL1 may be formed of a metal alloy or a conductive compound. The first electrode EL1 may be an anode. The first electrode EL1 may be a pixel electrode. The first electrode EL1 may be a reflective electrode. However, the present disclosure is not limited thereto, and the first electrode EL1 may be a transmissive electrode, a transflective electrode, and/or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture thereof (for example, a mixture of Ag and Mg). For example, the first electrode EL1 may have a multi-layered structure including a reflective film or a transflective film, both formed of the above example materials, and a transparent conductive film formed of indium tin oxide (ITO), indium zinc oxide (IZO), zinc oxide (ZnO), indium tin zinc oxide (ITZO), and/or the like. For example, the first electrode EL1 may be a multi-layered metal film or may have a structure in which metal films of ITO/Ag/ITO are stacked.

The hole transport region HTR is provided on the first electrode EL1. The hole transport region HTR may include a hole injection layer, a hole transport layer, and/or the like. The hole transport region HTR may have a single-layered structure having a single layer formed of a single material, a single-layered structure having a single layer formed of a plurality of different materials, or a multi-layered structure having a plurality of layers formed of a plurality of different materials.

The hole transport region HTR may be formed utilizing various methods such as vacuum deposition, spin coating, casting, Langmuir-Blodgett (LB), inkjet printing, laser printing, and/or laser induced thermal imaging (LITI).

The hole transport region HTR may include, for example, a carbazole-based derivative such as N-phenylcarbazole and/or polyvinylcarbazole, a fluorene-based derivative, a triphenylamine-based derivative such as N,N'-bis(3-methylphenyl)-N,N'-diphenyl-[1,1 biphenyl]-4,4'-diamine (TPD) and/or 4,4',4"-tris(N-carbazolyl)triphenylamine (TCTA), N,N'-di(naphthalene-I-yl)-N,N'-diplienyl-benzidine (NPD), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), and/or the like.

The thickness of the hole transport region HTR may be about 5 nm to about 1,500 nm, for example, about 10 nm to about 500 nm. When the thickness of the hole transport region HTR satisfies the above-described ranges, satisfactory (or suitable) hole transport properties may be obtained without a substantial increase in driving voltage.

The light emitting layer EML is provided on the hole transport region HTR. The light emitting layer EML may include a host and a dopant. In one or more embodiments, the light emitting layer EML may include an organic light-emitting material as a dopant material. For example, the light emitting layer EML may include a quantum dot as the dopant material. In one or more embodiments, the light emitting layer EML may further include an organic host material in addition to the dopant material. In the display panel DP of one or more embodiments, the light emitting layer EML included in the light emitting element ED may emit blue light having a center wavelength of about 420 nm to about 480 nm.

In the light emitting element ED of one or more embodiments, the electron transport region ETR is provided on the light emitting layer EML. The electron transport region ETR may include at least one of an electron transport layer or an electron injection layer, but the present disclosure is not limited thereto.

The electron transport region ETR may have a single-layered structure having a single layer formed of a single material, a single-layered structure having a single layer formed of a plurality of different materials, or a multi-layered structure having a plurality of layers formed of a plurality of different materials. For example, the electron transport region ETR may have a single-layered structure having a single layer of the electron injection layer or the electron transport layer, or a single-layered structure having a single layer formed of an electron injection material and an electron transport material. The thickness of the electron transport region ETR may be, for example, about 20 nm to about 150 nm.

The electron transport region ETR may be formed utilizing one or more suitable methods such as vacuum deposition, spin coating, casting, Langmuir-Blodgett (LB), inkjet printing, laser printing, and/or laser induced thermal imaging (LITI).

The electron transport region ETR may include, for example, an anthracene-based compound, Tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-Tri(1-phenyl-1H-benzo[d]imidazol-2-yl)phenyl (TPBi), or a mixture thereof. In one or more embodiments, the electron transport region ETR may include a halogenated metal such as LiF, NaCl, CsF, RbCl, and/or RbI, a lanthanum group metal such as Yb, a metal oxide such as $Li_2O$ and BaO, lithium quinolate (Liq), and/or the like.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like. When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/AI, Mo, Ti, Yb, or a compound or mixture including the same. For example, the second electrode EL2 may be of a multi-layered structure including a reflective film or a transflective film, both formed of the above example materials, and a transparent conductive film formed of indium tin oxide (ITO), indium zinc oxide (IZO), zinc oxide (ZnO), indium tin zinc oxide (ITZO), and/or the like.

In one or more embodiments, the second electrode EL2 may be connected to an auxiliary electrode. When the second electrode EL2 is connected to the auxiliary electrode, the resistance of the second electrode EL2 may be reduced.

Referring to FIG. 3 and FIG. 4A, in the display device DD of one or more embodiments, the area of each of the light-emitting regions PXA-B, PXA-G, and PXA-R may be different from each other. For example, in the present disclosure, the "area" may mean the area when viewed on a plane (e.g., in a plan view) defined by the first direction DR1 and the second direction DR2. For example, the light-emitting regions PXA-B, PXA-G, and PXA-R may have different areas according to the color of light emitted. At this time, the area may mean the area when viewed on a plane defined by the first direction DR1 and the second direction DR2 (e.g., in a plan view). For example, in the display device DD of one or more embodiments, the blue light-emitting region PXA-B which emits (is configured to emit) blue light may have the smallest area, and the green light-emitting region PXA-G which generates green light may have the largest area. However, the present disclosure is not limited thereto. The light-emitting regions PXA-B, PXA-G, and PXA-R may emit light of different colors other than blue light, green light, and red light, or the light-emitting regions PXA-B, PXA-G, and PXA-R may have the same (or substantially the same) area. In one or more embodiments, the light-emitting regions PXA-B, PXA-G, and PXA-R may be provided in an area ratio different from FIG. 3. For example, the light-emitting regions PXA-B, PXA-G, and PXA-R may have one or more suitable polygonal or circular shapes different from those illustrated in FIG. 3, and the arrangement structure of the light-emitting regions is not limited. For example, in one or more embodiments, the light-emitting regions PXA-B, PXA-G, and PXA-R may have the PENTILE® arrangement, or the DIAMOND PIXEL® arrangement. PENTILE® and DIAMOND PIXEL® are duly registered trademarks of Samsung Display Co., Ltd.

Referring to FIG. 4A and FIG. 4B, the encapsulation layer TFE may be disposed on the light emitting element ED to cover the light emitting element ED. The encapsulation layer TFE may be a single layer or a plurality of layers that are stacked. The encapsulation layer TFE may be a thin film encapsulation layer. The encapsulation layer TFE protects the light emitting element ED. The encapsulation layer TFE covers an upper surface of the second electrode EL2 disposed in the opening OH, and may fill the opening OH.

Referring to FIG. 4A and FIG. 4B, the display devices DD and DD-1 of embodiments of the present disclosure may include the optical structure layers PP and PP-1, respectively. The optical structure layers PP and PP-1 may have a function of changing the wavelength of at least a portion of light provided from the display panel DP or preventing or reducing color mixing between adjacent light-emitting regions. In one or more embodiments, the optical structure layers PP and PP-1 may block external light provided from the outside of the display device DD to the display panel DP.

The optical structure layers PP and PP-1 may perform an anti-reflection function of minimizing reflection caused by the external light.

Referring to FIG. 4A, the display device DD of one or more embodiments may include the light control layer CCL disposed on the display panel DP.

The light control layer CCL may include a light converting body. The light converting body may be a quantum dot, a fluorescent body, and/or the like. The light converting body may covert the wavelength of provided light and emit the light with a converted wavelength. For example, the light control layer CCL may be a layer including a quantum dot in at least a portion of the layer, or a layer including a fluorescent body.

The light control layer CCL may be disposed on the display panel DP having a capping layer CPL interposed therebetween. The light control layer CCL may include a plurality of partition wall portions BK disposed spaced apart from (separated from) each other and the light control units CCP-B, CCP-G, and CCP-R disposed between the partition wall portions BK. The partition wall portion BK may be formed by including a polymer resin and a liquid repellent additive. The partition wall portion BK may be formed by including a light absorbing material, or may be formed by including a pigment and/or a dye. For example, the partition wall portion BK may be formed by including a black pigment and/or a black dye to implement a black partition wall portion. When forming the black partition wall portion, carbon black and/or the like may be utilized as the black pigment and/or the black dye, but the present disclosure is not limited thereto.

The light control layer CCL may include a first light control unit CCP-B configured to transmit a first light, which is a source light provided from the light emitting element ED, a second light control unit CCP-G configured to convert the first light into a second light, and a third light control unit CCP-R configured to convert the first light into a third light. The second light may be light having a longer wavelength region (range) than the first light, and the third light may be light having a longer wavelength region (range) than the first light and the second light. For example, the first light may be light having a light emission wavelength of about 410 nm to about 480 nm, the second light may be light having a light emission wavelength of about 500 nm to about 600 nm, and the third light may be light having a light emission wavelength of about 620 nm to about 700 nm. The first light may be blue light, the second light may be green light, and the third light may be red light.

The second light control unit CCP-G and the third light control unit CCP-R may each include a light emitting body. The light emitting body may be a particle which converts the wavelength of incident light to emit light of a different wavelength. In one or more embodiments, a light emitting body included in the second light control unit CCP-G and/or in the third light control unit CCP-R may be a quantum dot or a fluorescent body. The second light control unit CCP-G may include a first quantum dot QD1 configured to convert the first light into the second light, and the third light control unit CCP-R may include a second quantum dot QD2 configured to convert the first light into the third light. The first light control unit CCP-B is a transmissive unit configured to transmit the first light without converting the wavelength thereof, and may not include (e.g., may exclude) a separate light emitting body. However, the present disclosure is not limited thereto, and a light emitting body such as a quantum dot which converts light incident on the first light control unit CCP-B into the first light may be included.

The quantum dot may include (e.g., may be selected from) a Group II-VI compound, a Group I-II-VI compound, a Group II-IV-VI compound, a Group I-II-IV-VI compound, a Group III-VI compound, a Group I-III-VI compound, a Group III-V compound, a Group III-II-V compound, a Group II-IV-V compound, a Group IV-VI compound, a Group IV compound, and/or a Group IV element, and/or a combination thereof.

The Group II-VI compound may include (e.g., may be selected from the group consisting of) a binary compound including (e.g., selected from the group consisting of) CdSe, CdTe, CdS, ZnS, ZnSe, ZnTe, ZnO, HgS, HgSe, HgTe, MgSe, MgS, and/or a mixture thereof, a ternary compound including (e.g., selected from the group consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or a mixture thereof, and/or a quaternary compound including (e.g., selected from the group consisting of) HgZnTeS, CdZnSeS, CdZnSeTe, CdZnSTe, CdHgSeS, CdHgSeTe, CdHgSTe, HgZnSeS, HgZnSeTe, and/or a mixture thereof. For example, the Group II-VI compound may further include a Group I metal and/or a Group IV element. The Group I-II-VI compound may include (e.g., may be selected from) CuSnS or CuZnS, and/or the Group II-IV-VI compound may include (e.g., may be selected from) ZnSnS and/or the like. The Group I-II-IV-VI compound may include (e.g., may be selected from) a quaternary compound including (e.g., selected from the group consisting of) $Cu_2ZnSnS_2$, $Cu_2ZnSnS_4$, $Cu_2ZnSnSe_4$, $Ag_2ZnSnS_2$, and/or a mixture thereof.

The Group III-VI compound may include a binary compound such as $In_2S_3$, $In_2Se_3$, and/or the like, a ternary compound such as $InGaS_3$, $InGaSe_3$, and/or the like, or any combination thereof.

The Group I-III-VI compound may include (e.g., may be selected from) a ternary compound including (e.g., selected from the group consisting of) AgInS, $AgInS_2$, CuInS, $CuInS_2$, $AgGaS_2$, $CuGaS_2$ $CuGaO_2$, $AgGaO_2$, $AgAlO_2$, and/or a mixture thereof, or a quaternary compound such as $AgInGaS_2$, $CuInGaS_2$, and/or the like.

The Group III-V compound may include (e.g., may be selected from the group consisting of) a binary compound including (e.g., selected from the group consisting of) GaN, GaP, GaAs, GaSb, AlN, AlP, AlAs, AlSb, InN, InP, InAs, InSb, and/or a mixture thereof, a ternary compound including (e.g., selected from the group consisting of) GaNP, GaNAs, GaNSb, GaPAs, GaPSb, AlNP, AlNAs, AlNSb, AlPAS, AlPSb, InGaP, InAlP, InNP, InNAs, InNSb, InPAs, InPSb, and/or a mixture thereof, and/or a quaternary compound including (e.g., selected from the group consisting of) GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or a mixture thereof. For example, the Group III-V compound may further include a Group II metal. For example, InZnP and/or the like may include (e.g., may be) the Group III-II-V compound.

The Group II-IV-V compound may be a ternary compound including (e.g., selected from the group consisting of) ZnSnP, $ZnSnP_2$, $ZnSnAs_2$, $ZnGeP_2$, $ZnGeAs_2$, $CdSnP_2$, $CdGeP_2$, and/or a mixture thereof.

The Group IV-VI compound may include (e.g., may be selected from the group consisting of) a binary compound including (e.g., selected from the group consisting of) SnS, SnSe, SnTe, PbS, PbSe, PbTe, and/or a mixture thereof, a ternary compound including (e.g., selected from the group consisting of) SnSeS, SnSeTe, SnSTe, PbSeS, PbSeTe, PbSTe, SnPbS, SnPbSe, SnPbTe, and/or a mixture thereof, and/or a quaternary compound including (e.g., selected from the group consisting of) SnPbSSe, SnPbSeTe, SnPbSTe, and/or a mixture thereof. The Group IV element may include (e.g., may be selected from the group consisting of) Si, Ge, and/or a mixture thereof. The Group IV compound may be a binary compound including (e.g., selected from the group consisting of) SiC, SiGe, and/or a mixture thereof.

Each element included in a multi-element compound such as the binary compound, the ternary compound, and the quaternary compound, may be present in a particle at a uniform concentration (e.g., substantially uniform concentration) or non-uniform concentration. For example, the aforementioned formulas refer to types or kinds of elements included in a compound, and element ratios in the compound may be different. For example, $AgInGaS_2$ may refer to $AgIn_xGa_{1-x}S_2$ (wherein x is a real number between 0 and 1).

At this time, a binary compound, a ternary compound, or a quaternary compound may be present in a particle at a uniform concentration (e.g., substantially uniform concentration), or may be present in the same particle with a partially different concentration distribution (e.g., with different concentrations at different portions of the particle). In one or more embodiments, the binary compound, the ternary compound, or the quaternary compound may have a core/shell structure in which one quantum dot surrounds another quantum dot. In the core/shell structure, the binary compound, the ternary compound, or the quaternary compound may have a concentration gradient in which the concentration of an element present in the shell becomes lower toward the center of the core.

In one or more embodiments, a quantum dot may have the above core-shell structure including a core having a nano-crystal and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or multiple layers. An example of the shell may be an oxide of a metal or a non-metal, a semiconductor compound, or a combination thereof.

The shell may include a material different from that of the core. For example, the core may include a first semiconductor nano-crystal, and the shell may include a second semiconductor nano-crystal different from the first semiconductor nano-crystal. In one or more embodiments, the shell may include an oxide of a metal or a non-metal. The shell may include an oxide of a metal or a non-metal, a semiconductor nano-crystal, or a combination thereof.

The shell may be formed of a single material, but may be formed to have a concentration gradient. For example, the shell may have a concentration gradient in which, as the shell gets more adjacent to the core, the concentration of the second semiconductor nano-crystal present in the shell decreases, and the concentration of the first semiconductor nano-crystal included in the core increases. In one or more embodiments, the shell may have a structure of a plurality of layers which include different materials.

For example, the oxide of a metal or a non-metal may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound such as $MgAl_2O_4$, $CoFe_2O_4$, $NiFe_2O_4$, and/or $CoMn_2O_4$. However, the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like. However, the present disclosure is not limited thereto.

The quantum dot may have a full width of half maximum (FWHM) of a light emission wavelength spectrum of about 45 nm or less, preferably about 40 nm or less, more preferably about 30 nm or less, and color purity or color reproducibility may be improved in the above ranges. In one or more embodiments, light emitted through such a quantum dot is emitted in all directions, so that a wide viewing angle may be improved.

In one or more embodiments, although the form of a quantum dot is not particularly limited as long as it is a form generally available in the art, a quantum dot in the form of, for example, spherical, pyramidal, multi-arm, or cubic nanoparticles, nanotubes, nanowires, nanofibers, nanoplate particles, and/or the like may be utilized.

The quantum dot may adjust an energy band gap by adjusting the size of the quantum dot or adjusting an element ratio in a quantum dot compound, so that light of one or more suitable wavelength bands may be obtained from a quantum dot light emitting layer. Therefore, a light emitting element which emits (is configured to emit) light of one or more suitable wavelengths may be implemented by utilizing a quantum dot as described above (utilizing quantum dots of different sizes or having different element ratios in a quantum dot compound). For example, the adjustment of the size of the quantum dot or the element ratio in the quantum dot compound may be selected to emit red, green, and/or blue light. In one or more embodiments, the quantum dots may be configured to emit white light by combining light of one or more suitable colors. For example, when the quantum dot has one or more suitable light emitting colors such as blue, red, and green, the quantum dots having different light emitting colors may have different materials of the core.

The quantum dot may adjust the color of emitted light according to the particle size thereof, and accordingly, the quantum dot may have one or more suitable light emitting colors such as blue, red, green, and/or the like. The smaller the particle size of a quantum dot, light of the shorter wavelength region may be emitted. For example, the particle size of a quantum dot emitting green light may be smaller than the particle size of a quantum dot emitting red light, and the particle size of a quantum dot emitting blue light may be smaller than the particle size of the quantum dot emitting green light.

Each of the plurality of light control units CCP-B, CCP-G, and CCP-R included in the light control layer CCL may further include a scattering body SP. The first light control unit CCP-B may include only the scattering body SP, the second light control unit CCP-G may include the first quantum dot QD1 and the scattering body SP, and the third light control unit CCP-R may include the second quantum dot QD2 and the scattering body SP.

The scattering body SP may be an inorganic particle. For example, the scattering body SP may include at least one of $TiO_2$, ZnO, $Al_2O_3$, $SiO_2$, or hollow silica. The scattering body SP may include any one of $TiO_2$, ZnO, $Al_2O_3$, $SiO_2$, and hollow silica, or may be a mixture of two or more materials including (e.g., selected from) $TiO_2$, ZnO, $Al_2O_3$, $SiO_2$, and/or hollow silica.

Each of the first light control unit CCP-B, the second light control unit CCP-G, and the third light control unit CCP-R may include base resins BR1, BR2, and BR3 which disperse the quantum dots QD1 and QD2 and the scattering body SP. In one or more embodiments, the first light control unit CCP-B may include the scattering body SP dispersed in a first base resin BR1, the second light control unit CCP-G may include the first quantum dot QD1 and the scattering body SP dispersed in a second base resin BR2, and the third light control unit CCP-R may include the second quantum dot QD2 and the scattering body SP dispersed in a third base resin BR3. The base resins BR1, BR2, and BR3 are media in which the quantum dots QD1 and QD2 and the scattering body SP are dispersed, and may be formed of one or more suitable resin compositions which may be generally referred to as a binder. For example, the base resins BR1, BR2, and BR3 may each be an acrylic resin, a urethane-based resin, a silicone-based resin, an epoxy resin, and/or the like. The base resins BR1, BR2, and BR3 may each be a transparent resin. In one or more embodiments, the first base resin BR1, the second base resin BR2, and the third base resin BR3 may be the same as or different from each other.

The light control layer CCL may further include the capping layer CPL. The capping layer CPL may be disposed on the light control units CCP-B, CCP-G, and CCP-R and the partition wall portion BK. The capping layer CPL may serve to prevent or substantially prevent the penetration of moisture and/or oxygen (hereinafter, referred to as 'moisture/oxygen'). The capping layer CPL may be disposed on the light control units CCP-B, CCP-G, and CCP-R to block the exposure of the light control units CCP-B, CCP-G, and CCP-R to moisture/oxygen. The capping layer CPL may include at least one inorganic layer.

In the display device DD of one or more embodiments, the optical layer OPL may include an overcoat layer OC and a color filter layer CFL.

The color filter layer CFL may include color filters CF. The color filter layer CFL may include a first color filter CF-B which transmits a portion of the source light (the first light), a second color filter CF-G which transmits the second light, and a third color filter CF-R which transmits the third light. In one or more embodiments, the color filter layer CFL may include a first color filter CF-B configured to transmit blue light, a second color filter CF-G configured to transmit green light, and a third color filter CF-R configured to transmit red light. In one or more embodiments, the first color filter CF-B may be a blue color filter, the second color filter CF-G may be a green color filter, and the third color filter CF-R may be a red color filter.

Each of the color filters CF may include a polymer photosensitive resin and a colorant. The first color filter CF-B may include a blue colorant, the second color filter CF-G may include a green colorant, and the third color filter CF-R may include a red colorant. The first color filter CF-B may include a blue pigment and/or a blue dye, the second color filter CF-G may include a green pigment and/or a green dye, and the third color filter CF-R may include a red pigment and/or a red dye.

The first to third color filters CF-B, CF-G, and CF-R may be disposed respectively corresponding to a first light-emitting region PXA-B, a second light-emitting region PXA-G, and a third light-emitting region PXA-R. In one or more embodiments, the first to third color filters CF-B, CF-G, and CF-R may be disposed respectively corresponding to the first to third light control units CCP-B, CCP-G, and CCP-R.

In one or more embodiments, a plurality of color filters CF-B, CF-G, and CF-R transmitting different light may be disposed overlapping with each other in portions corresponding to the peripheral regions NPXA disposed between the light-emitting regions PXA-B, PXA-G, and PXA-R. The plurality of color filters CF-B, CF-G, and CF-R are disposed overlapping each other in the third direction DR3, which is the thickness direction, so that boundaries between adjacent light-emitting regions PXA-B, PXA-G, and PXA-R may be distinguished. Accordingly, an effect of blocking external light is increased, so that the peripheral regions may have the same (or substantially the same) function as a black matrix. The overlapped structure of the plurality of color filters CF-B, CF-G, and CF-R may have a function of preventing or reducing color mixing.

For example, the color filter layer CFL may include a light blocking portion to distinguish the boundaries between adjacent color filters CF-B, CF-G, and CF-R. The light blocking portion may be formed of a blue filter, or may be formed by including an organic light blocking material or an inorganic light blocking material containing a black pigment and/or a black dye.

However,, the present disclosure is not limited thereto, and the first color filter CF-B may not include (e.g., may exclude) a pigment and/or a dye. The first color filter CF-B may include a polymer photosensitive resin, but may not include (e.g., may exclude) a pigment and/or a dye. The first color filter CF-B may be transparent. The first color filter CF-B may be formed of a transparent photosensitive resin.

The color filter layer CFL may further include a buffer layer BFL. For example, the buffer layer BFL may be a protection layer for protecting the filters CF-B, CF-G, and CF-R. The buffer layer BFL may be an inorganic material layer including at least one inorganic material of (among) silicon nitride, silicon oxide, and/or silicon oxynitride. The buffer layer BFL may be formed of a single layer or a plurality of layers.

In the one or more embodiments of FIG. 4A, it is illustrated that the first color filter CF-B of the color filter layer CFL overlaps the second color filter CF-G and the third color filter CF-R, but the present disclosure is not limited thereto. For example, the first to third color filters CF-B, CF-G, and CF-R may be distinguished by the light blocking portion, and may not overlap each other. For example, in one or more embodiments, the first to third color filters CF-B, CF-G, and CF-R may be disposed respectively corresponding to the blue light-emitting region PXA-B, the green light-emitting region PXA-G, and the red light-emitting region PXA-R.

In the optical layer OPL of the display device DD of one or more embodiments, a polarizing layer may be further included. The polarizing layer may block external light provided to the display panel DP from the outside. The polarizing layer may block a portion of the external light. When the display device DD includes the polarizing layer, the color filter layer CFL may not be provided.

In one or more embodiments, the polarizing layer may reduce reflected light generated in the display panel DP by external light. For example, the polarizing layer may serve to block reflected light which is generated when light provided from the outside of the display device DD is incident on the display panel DP and then emitted. The polarizing layer may be a circular polarizer having an anti-reflection function or the polarizing layer may include a linear polarizer and a $\lambda/4$ phase retarder. For example, the polarizing layer may be disposed on the overcoat layer OC to be exposed, or the polarizing layer may be disposed in a lower portion of the overcoat layer OC.

Then overcoat layer OC may be disposed on the color filter layer CFL. The overcoat layer OC may include an organic layer. The overcoat layer OC may include an organic matter having high strength and high planarization properties. The overcoat layer OC may provide a flat upper surface. For example, the overcoat layer OC may perform a function of an upper base layer which provides a reference surface on the color filter layer CFL. The overcoat layer OC may be a member providing a base surface on which the optical layer OPL and the light control layer CCL disposed in a lower portion are disposed. The overcoat layer OC may be an inorganic layer, an organic layer, or a composite material layer. However, the present disclosure is not limited thereto, and the overcoat layer OC may be a glass substrate, a metal substrate, a plastic substrate, and/or the like.

An anti-reflection layer ARL is disposed on the overcoat layer OC. The anti-reflection layer ARL may be directly disposed on the overcoat layer OC. For example, the anti-reflection layer ARL may be in contact with an upper surface of the overcoat layer OC. The anti-reflection layer ARL may be a layer having low reflectance, thereby blocking external light. The anti-reflection layer ARL may be a layer having a plurality of layers with different refractive indices, thereby effectively blocking external light through destructive interference. The reflectance on an upper surface of the anti-reflection layer ARL may be about 2% or less. In a visible light range of about 430 nm to about 780 nm, the reflectance on the upper surface of the anti-reflection layer ARL may be about 2% or less. At a wavelength of about 550 nm, the reflectance on the upper surface of the anti-reflection layer ARL may be about 2% or less.

Referring to FIG. 4B, the display device DD-1 of one or more embodiments may include the display panel DP and the optical structure layer PP-1 disposed on the display panel DP. In the display device DD-1 according to one or more embodiments, the optical structure layer PP-1 includes an optical layer OPL-1 disposed on the display panel DP and an anti-reflection layer ARL disposed on the optical layer OPL-1. The optical layer OPL-1 may include a light control layer CCL-1, a color filter layer CFL-1, and an overcoat layer OC-1, which are sequentially stacked.

The light control layer CCL-1 may be disposed on the display panel DP with a capping layer CPL interposed therebetween. The light control layer CCL-1 may include a plurality of partition wall portions BK-1 and light control units CCP-B1, CCP-G1, and CCP-R1 disposed between the partition wall portions BK-1.

The color filter layer CFL-1 may include a color filter unit CF-1 including a plurality of filters CF-B, CF-G, and CF-R, a light blocking portion BM, and a buffer layer BFL.

When compared to the display device DD illustrated in FIG. 4A, the display device DD-1 according to one or more embodiments illustrated in FIG. 4B has the light control layer CCL-1 and the color filter layer CFL-1 disposed with an upper surface of an encapsulation layer TFE as a base surface. For example, the light control units CCP-B1, CCP-G1, and CCP-R1 of the light control layer CCL-1 may be formed on the display panel DP by a continuous process, and the filters CF-B, CF-G, and CF-R of the color filter layer CFL-1 may be sequentially formed on the light control layer CCL-1 through a continuous process. The light control layer CCL-1 may be formed having an upper surface of the capping layer CPL disposed on the display panel DP as a base surface, and may have a shape inverted upside down from that of the light control layer CCL illustrated in FIG. 4A. Specifically, each of the plurality of partition wall portions BK-1 and a plurality of light control units CCP-B1, CCP-G1, CCP-R1 may have a shape inverted upside down from that illustrated in FIG. 4A. The color filter layer CFL-1 is formed having an upper surface of light control layer CCL-1 as a base surface, and may have a shape different from that illustrated in FIG. 4A.

In the color filter layer CFL-1 of one or more embodiments, the light blocking portion BM may be a black matrix. The light blocking portion BM may be formed by including an organic light blocking material or an inorganic light blocking material containing a black pigment and/or a black dye. The light blocking portion BM prevents or substantially prevents a light leakage phenomenon, and may distinguish boundaries between adjacent color filters CF-B, CF-G, and CF-R.

Referring to FIG. 4C, a display panel DP included in a display device DD-2 of one or more embodiments includes a light emitting element ED-1, and the light emitting element ED-1 may be a micro LED element (e.g., an LED element on a micro scale) or a nano LED element (e.g., an LED element on a nano scale). The light emitting element ED-1 may be electrically connected to a contact portion S-C, and the length and the width of the light emitting element ED-1 may be between hundreds of nanometers and hundreds of micrometers. The light emitting element ED-1 may be an LED element including an active layer and at least one semiconductor material layer. The light emitting element ED-1 may further include an insulation layer. The light emitting element ED-1 may be patterned and disposed to overlap each of light-emitting regions PXA-B, PXA-G, and PXA-R. The display panel DP may include a buffer layer BFL disposed on the light emitting element ED-1. The buffer layer BFL may be disposed on the light emitting element ED-1 to cover the light emitting element ED-1.

Compared to the display devices DD and DD-1 illustrated in FIG. 4A and FIG. 4B, the display device DD-2 of one or more embodiments of FIG. 4C does not include a light control layer and a color filter layer in the optical structure layer PP-2. For example, the display device DD-2 of one or more embodiments includes an overcoat layer OC-2 disposed on the buffer layer BFL, and an anti-reflection layer ARL may be disposed on the overcoat layer OC-2. The overcoat layer OC-2 may include an organic layer. The overcoat layer OC-2 may include an organic matter having high strength and high planarization properties. The overcoat layer OC-2 provides a flat surface, and may provide a reference layer on which the anti-reflection layer ARL is to be disposed. The overcoat layer OC-2 may be an inorganic layer, an organic layer, or a composite material layer. However, the present disclosure is not limited thereto, and the overcoat layer OC-2 may be a glass substrate, a metal substrate, a plastic substrate, and/or the like. For example, in the display device DD-2 of one or more embodiments illustrated in FIG. 4C, any one of the buffer layer BFL and the overcoat layer OC-2 may not be provided.

Figure 5A:
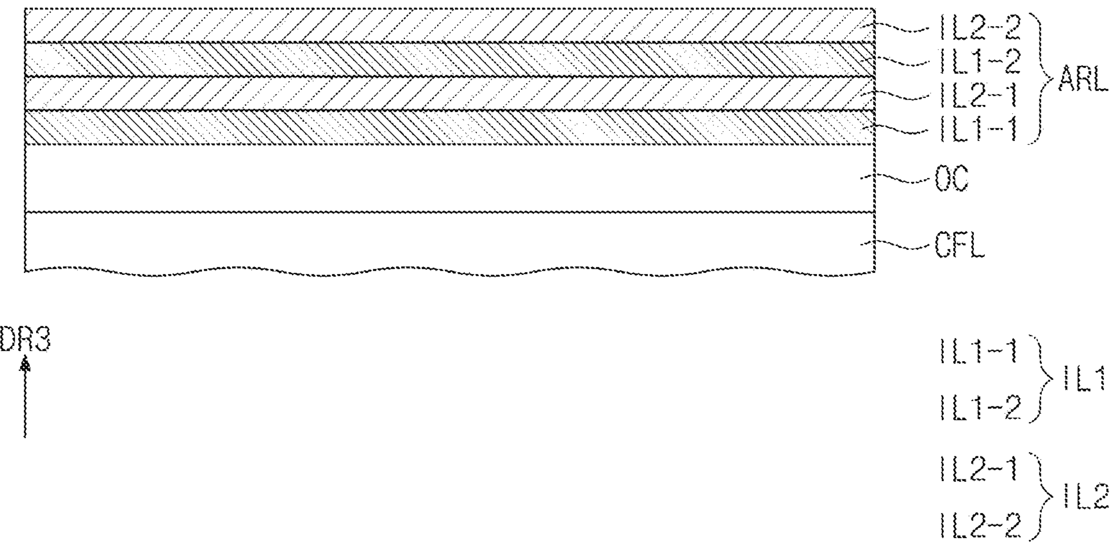
FIG. 5A to FIG. 5C are cross-sectional views showing some components of a display device according to embodiments of the present disclosure.
Figure 5B:
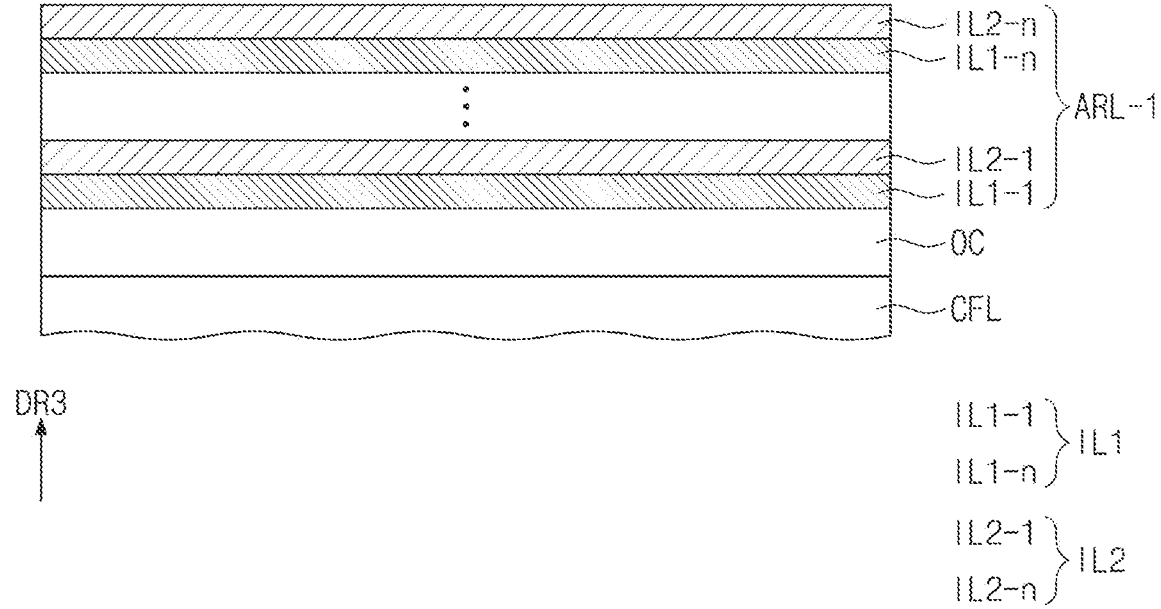
Figure 5C:
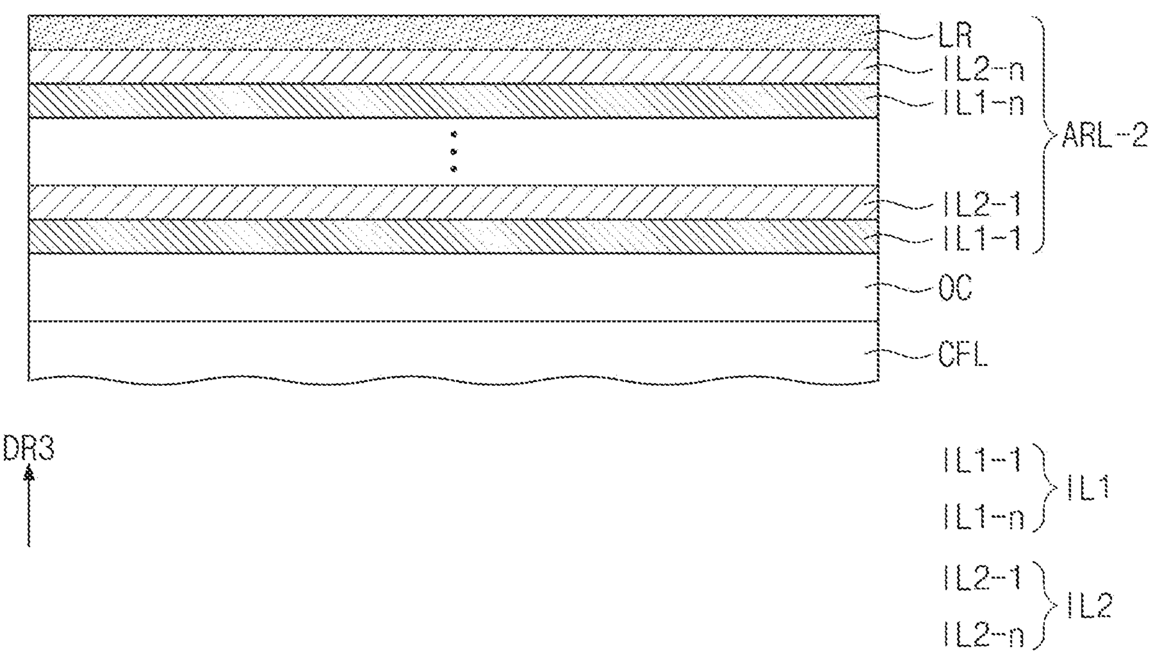

FIG. 5A to FIG. 5C are cross-sectional views showing some components of a display device according to embodiments of the present disclosure. In each of FIG. 5A to FIG. 5C, a structure in which a color filter layer CFL, an overcoat layer OC, and anti-reflection layers ARL, ARL-1, or ARL-2, respectively, are stacked is schematically illustrated. Hereinafter, referring to FIG. 5A to FIG. 5C, the anti-reflection layers ARL, ARL-1, and ARL-2 are respectively described in more detail.

Referring to FIG. 4A and FIG. 5A together, the anti-reflection layer ARL is disposed on the overcoat layer OC, and includes a plurality of layers. The anti-reflection layer ARL includes a plurality of inorganic layers IL1 and IL2 disposed on the overcoat layer OC.

The plurality of inorganic layers IL1 and IL2 include at least one first inorganic layer IL1 and at least one second inorganic layer IL2. Each of the first inorganic layer IL1 and the second inorganic layer IL2 may be provided as a plurality of layers. As illustrated in FIG. 5A, the first inorganic layer IL1 may include a 1-1 inorganic layer IL1-1 and a 1-2 inorganic layer IL1-2. The second inorganic layer IL2 may include a 2-1 inorganic layer IL2-1 and a 2-2 inorganic layer IL2-2.

The first inorganic layer IL1 and the second inorganic layer IL2, each of which is provided as a plurality of layers, may be alternately provided. For example, any two layers of the plurality of first inorganic layers IL1 may not be continuously stacked, and any one of the second inorganic layers IL2 may be disposed between the plurality of first inorganic layers IL1. For example, any two layers of the plurality of second inorganic layers IL2 may not be continuously stacked, and any one of the first inorganic layers IL1 may be disposed between the plurality of second inorganic layers IL2.

As illustrated in FIG. 5A, the 2-1 inorganic layer IL2-1 is disposed on the 1-1 inorganic layer IL1-1, the 1-2 inorganic layer IL1-2 is disposed on the 2-1 inorganic layer IL2-1, and the 2-2 inorganic layer IL2-2 may be disposed on the 1-2 inorganic layer IL1-2. The 1-1 inorganic layer IL1-1, the 2-1 inorganic layer IL2-1, the 1-2 inorganic layer IL1-2, and the 2-2 inorganic layer IL2-2 may have a continuously stacked structure. For example, the 2-1 inorganic layer IL2-1 may be directly disposed on the 1-1 inorganic layer IL1-1, the 1-2 inorganic layer IL1-2 may be directly disposed on the 2-1 inorganic layer IL2-1, and the 2-2 inorganic layer IL2-2 may be directly disposed on the 1-2 inorganic layer IL1-2. A layer disposed in the lowermost portion of (among) the plurality of inorganic layers IL1 and IL2 may be disposed directly on the overcoat layer OC. For example, in FIG. 5A, the 1-1 inorganic layer IL1-1 included in the first inorganic layer IL1 of (among) the plurality of inorganic layers IL1 and IL2 is illustrated as being directly disposed on the overcoat layer OC, but the present disclosure is not limited thereto, and a layer included in the second inorganic layer IL2 may be directly disposed on the overcoat layer OC. For example, the 2-1 inorganic layer IL2-1 may be directly disposed on the overcoat layer OC, and the 1-1 inorganic layer IL1-1 may be directly disposed on the 2-1 inorganic layer IL2-1.

The first inorganic layer IL1 has a first refractive index, and the second inorganic layer IL2 has a second refractive index which is higher than the first refractive index. For example, the first refractive index and the second refractive index may be defined at a wavelength of about 550 nm. At the wavelength of about 550 nm, the first refractive index may be about 1.50 to about 1.70. At the wavelength of about 550 nm, the second refractive index may be about 1.70 to about 1.90. For example, at the wavelength of about 550 nm, the first refractive index may be about 1.58, and the second refractive index may be about 1.71. Each of the first inorganic layers IL1 provided as a plurality of layers may have the first refractive index, and each of the second inorganic layers IL2 provided as a plurality of layers may have the second refractive index.

Each of the first inorganic layer IL1 and the second inorganic layer IL2 includes a silicon oxynitride (SiON). Although each of the first inorganic layer IL1 and the second inorganic layer IL2 includes a silicon oxynitride, contents (e.g., amounts) of oxygen, nitrogen, and silicon of the silicon oxynitride included in each of the first inorganic layer IL1 and the second inorganic layer IL2 may be different from each other. Each of the first inorganic layer IL1 and the second inorganic layer IL2 may include a silicon oxynitride having a different detailed composition, and thus may have different refractive indices from each other as described above. Each of the first inorganic layer IL1 and the second inorganic layer IL2 may be a layer composed of a silicon oxynitride. The first inorganic layer IL1 provided as a plurality of layers and the second inorganic layer IL2 provided as a plurality of layers may each include a silicon oxynitride. Each of the first inorganic layer IL1 and the second inorganic layer IL2 includes a silicon oxynitride, and thus may be formed in a continuous process in the same chamber, and may form a film through a homogeneous gas. Each of the first inorganic layer IL1 and the second inorganic layer IL2 is formed by providing an oxygen gas, a nitrogen gas, and a silicon gas in the same chamber, and when forming each of the first inorganic layer IL1 and the second inorganic layer IL2, contents (e.g., amounts) of oxygen, nitrogen, and silicon of the silicon oxynitride included in each of the first inorganic layer IL1 and the second inorganic layer IL2 may be formed to be different from each other by adjusting the partial pressure of each of the oxygen gas, the nitrogen gas, and the silicon gas.

The oxygen content (e.g., amount) of each of the first inorganic layer IL1 and the second inorganic layer IL2 may be different from each other. When the content (e.g., amount) of oxygen with respect to the total content (e.g., amount) of elements in the first inorganic layer IL1 is defined as a first oxygen content (e.g., amount), and the content (e.g., amount) of oxygen with respect to the total content (e.g., amount) of elements in the second inorganic layer IL2 is defined as a second oxygen content (e.g., amount), the first oxygen content (e.g., amount) and the second oxygen content (e.g., amount) may be different from each other. The first oxygen content (e.g., amount) may be greater than the second oxygen content (e.g., amount). For example, the first inorganic layer IL1 may be an oxygen-rich silicon oxynitride layer having a higher oxygen content (e.g., amount) than the second inorganic layer IL2.

The nitrogen content (e.g., amount) of each of the first inorganic layer IL1 and the second inorganic layer IL2 may be different from each other. When the content (e.g., amount) of nitrogen with respect to the total content (e.g., amount) of elements in the first inorganic layer IL1 is defined as a first nitrogen content (e.g., amount), and the content (e.g., amount) of nitrogen with respect to the total content (e.g., amount) of elements in the second inorganic layer IL2 is defined as a second nitrogen content (e.g., amount), the first nitrogen content (e.g., amount) and the second nitrogen content (e.g., amount) may be different from each other. The first nitrogen content (e.g., amount) may be less than the second nitrogen content (e.g., amount). For example, the second inorganic layer IL2 may be a nitrogen-rich silicon oxynitride layer having a higher nitrogen content (e.g., amount) than the first inorganic layer IL1. Because the second inorganic layer IL2 has a higher nitrogen content (e.g., amount) and a lower oxygen content (e.g., amount) compared to the first inorganic layer IL1, a second refractive index of the second inorganic layer IL2 may be higher than a first refractive index of the first inorganic layer IL1.

The first inorganic layer IL1 may include about 23 at % to about 26 at % of oxygen, about 31 at % to about 34 at % of nitrogen, and about 41 at % to about 44 at % of silicon with respect to the total content (e.g., amount) of the first inorganic layer IL1. The first inorganic layer IL1 may be a layer composed of about 23 at % to about 26 at % of oxygen, about 31 at % to about 34 at % of nitrogen, and about 41 at % to about 44 at % of silicon with respect to the total content (e.g., amount) of the first inorganic layer IL1. The first inorganic layer IL1 may include, for example, about 24.22 at % of oxygen, about 32.94 at % of nitrogen, and about 42.85 at % of silicon with respect to the total content (e.g., amount) of the first inorganic layer IL1.

The second inorganic layer IL2 may include about 20 at % to about 23 at % of oxygen, about 35 at % to about 38 at % of nitrogen, and about 39 at % to about 42 at % of silicon with respect to the total content (e.g., amount) of the second inorganic layer IL2. The second inorganic layer IL2 may be a layer composed of about 20 at % to about 23 at % of oxygen, about 35 at % to about 38 at % of nitrogen, and about 39 at % to about 42 at % of silicon with respect to the total content (e.g., amount) of the second inorganic layer IL2. The second inorganic layer IL2 may include, for example, about 22.12 at % of oxygen, about 36.06 at % of nitrogen, and about 41.82 at % of silicon with respect to the total content (e.g., amount) of the second inorganic layer IL2. The composition analysis of each of the first inorganic layer IL1 and the second inorganic layer IL2 may be performed through X-ray photoelectron spectroscopy (XPS).

A total sum of thicknesses of the plurality of inorganic layers IL1 and IL2 included in the anti-reflection layer ARL may be about 100 nm to about 1000 nm. For example, the sum of the thicknesses of the plurality of inorganic layers IL1 and IL2 may be about 200 nm to about 600 nm.

In the first inorganic layer IL1 and the second inorganic layer IL2, each of which is provided as a plurality of layers, the thickness of each of the plurality of first inorganic layers IL1 and the plurality of second inorganic layers IL2 may be about 10 nm to about 150 nm. As illustrated in FIG. 5A, the plurality of inorganic layers IL1 and IL2 include the 1-1 inorganic layer IL1-1, the 2-1 inorganic layer IL2-1, the 1-2 inorganic layer IL1-2, and the 2-2 inorganic layer IL2-2, which are sequentially stacked, and the thickness of each of the 1-1 inorganic layer IL1-1, the 2-1 inorganic layer IL2-1, the 1-2 inorganic layer IL1-2, and the 2-2 inorganic layer IL2-2 may be about 10 nm to about 150 nm.

The anti-reflection layer ARL may have low reflectance. The reflectance on an upper surface of the anti-reflection layer ARL may be about 0.1% or less. For example, the reflectance on the upper surface of the anti-reflection layer ARL may be about 0 to about 0.05%. The anti-reflection layer ARL includes a plurality of inorganic layers IL1 and IL2, and has a structure in which each of the plurality of first inorganic layers IL1 and the plurality of second inorganic layers IL2 included in the anti-reflection layer ARL is alternately disposed with each other while having a refractive index in the above range, so that the anti-reflection layer ARL may effectively prevent or substantially prevent external light from being reflected from the surface of the display device DD through destructive interference.

The overcoat layer OC providing a base surface on which the anti-reflection layer ARL is disposed may have a greater thickness than each layer included in the anti-reflection layer ARL. In one or more embodiments, the overcoat layer OC may have a thickness of about 3 μm to about 10 μm. In one or more embodiments, the overcoat layer OC may have a refractive index lower than that of the plurality of inorganic layers IL1 and IL2 included in the anti-reflection layer ARL. The overcoat layer OC may have a refractive index of about 1.45 to about 1.53.

Referring to FIG. 5B, an anti-reflection layer ARL-1 of one or more embodiments may include an n number of first inorganic layers IL1-1 to IL1-*n*, and an n number of second inorganic layers IL2-1 to IL2-*n*. For example, n may be an integer of 3 to 10. The n may be, for example, an integer of 3 to 5. For example, the anti-reflection layer ARL-1 of one or more embodiments includes a repeating unit structure including any one of the plurality of first inorganic layers IL1 and any one of the plurality of second inorganic layers IL2, and may have a structure of the inorganic layers IL1 and IL2 in which 3 to 10 of the repeating unit structures are sequentially stacked. The number of the repeating unit structures and the thickness of each repeating unit structure may be selected from the aforementioned thickness range and a range for performing an anti-reflection function of the anti-reflection layer ARL-1.

The content of the first inorganic layer IL1 described with reference to FIG. 5A may be applied to each of the n number of first inorganic layers IL1-1 to IL1-*n* included in the anti-reflection layer ARL-1. The content of the second inorganic layer IL2 described with reference to FIG. 5A may be applied to each of the n number of second inorganic layers IL2-1 to IL2-*n* included in the anti-reflection layer ARL-1.

Referring to FIG. 5C, one or more embodiments an anti-reflection layer ARL-2 of one or more embodiments may further include a low refractive layer LR disposed on the plurality of inorganic layers IL1 and IL2. The low refractive layer LR may be a layer having a lower refractive index than the plurality of inorganic layers IL1 and IL2.

A separate layer may not be provided in an upper portion of the low refractive layer LR. For example, the low refractive layer LR may be the outermost layer disposed in the uppermost portion of the anti-reflection layer ARL-2. An upper surface of the low refractive layer LR may define the outermost surface of the anti-reflection layer ARL-2. The low refractive layer LR may be the outermost layer of the display device DD including the anti-reflection layer ARL-2.

In the anti-reflection layer ARL-2 of one or more embodiments, the plurality of inorganic layers IL1 and IL2 may have a refractive index of about 1.5 or greater, and the low refractive layer LR may have a refractive index of about 1.3 to about less than 1.5. The anti-reflection layer ARL-2 of one or more embodiments has a structure in which each of the plurality of first inorganic layers IL1 and the plurality of second inorganic layers IL2 is alternately disposed with each other while having a refractive index in the aforementioned range, and the low refractive layer LR having a low refractive index is disposed in (at) the uppermost portion of the anti-reflection layer ARL-2, so that it is possible to effectively prevent or reduce external light from being reflected from the surface of the anti-reflection layer ARL-2 through destructive interference.

In a display device of one or more embodiments, an anti-reflection layer provided on a display panel is not in a film form, but is a layer directly formed on an upper surface of an overcoat layer through deposition and/or the like, and the anti-reflection layer includes a plurality of inorganic layers in which a first inorganic layer and a second inorganic layer having different refractive indices are alternately stacked. Both the first inorganic layer and the second inorganic layer included in the plurality of inorganic layers include a silicon oxynitride, but have different refractive indices from each other due to different oxygen contents (e.g., amounts), nitrogen contents (e.g., amounts), and/or the like. For example, the first inorganic layer has a first refractive index, and the second inorganic layer has a second refractive index which is higher than the first refractive index. The display device of one or more embodiments includes a structure in which the first inorganic layer and the second inorganic layer having different refractive indices while each including a silicon oxynitride are alternately stacked, and accordingly, it is possible to form an anti-reflection layer structure having low reflectance and high capping properties while being formed through a simple process, so that the display device may have improved durability and visibility.

For example, in the anti-reflection layer included in the display device of one or more embodiments, both the first inorganic layer and the second inorganic layer included in the plurality of inorganic layers are formed of a silicon oxynitride, and accordingly, it is possible to form a structure in which the first inorganic layer and the second inorganic layer are alternately stacked in the same chamber, so that a process of forming the anti-reflection layer may be simplified. In one or more embodiments, because the first inorganic layer and the second inorganic layer are formed through a homogeneous gas for forming a silicon oxynitride, it is possible to form a film at a low temperature, and because it is possible to easily control foreign particles in a process of forming the first inorganic layer and the second inorganic layer, process steps may be simplified.

In the anti-reflection layer included in the display device of one or more embodiments, each of the first inorganic layer and the second inorganic layer includes a silicon oxynitride having a different detailed composition, and thus has different refractive indices from each other. In the anti-reflection layer of one or more embodiments, because it is possible to form an alternating stacking structure of a first inorganic layer and a second inorganic layer including silicon oxynitrides having different detailed compositions through partial pressure adjustment of a source gas in the same chamber, the refractive index of each of the first inorganic layer and the second inorganic layer included in a plurality of inorganic layers may be easily changed through a simple process condition change, so that the formation of an anti-reflection layer structure having a range of refractive index and reflection properties consistent with other compositions included in a display device may be facilitated.

In one or more embodiments, the plurality of inorganic layers of one or more embodiments include a structure in which a plurality of first layers and a plurality of second layers, all of which includes a silicon oxynitride, are alternately stacked, and accordingly, properties of preventing or substantially preventing moisture and oxygen from entering a display device from the outside are improved, so that it is possible to form an anti-reflection layer structure having high capping properties.

Figure 6A:
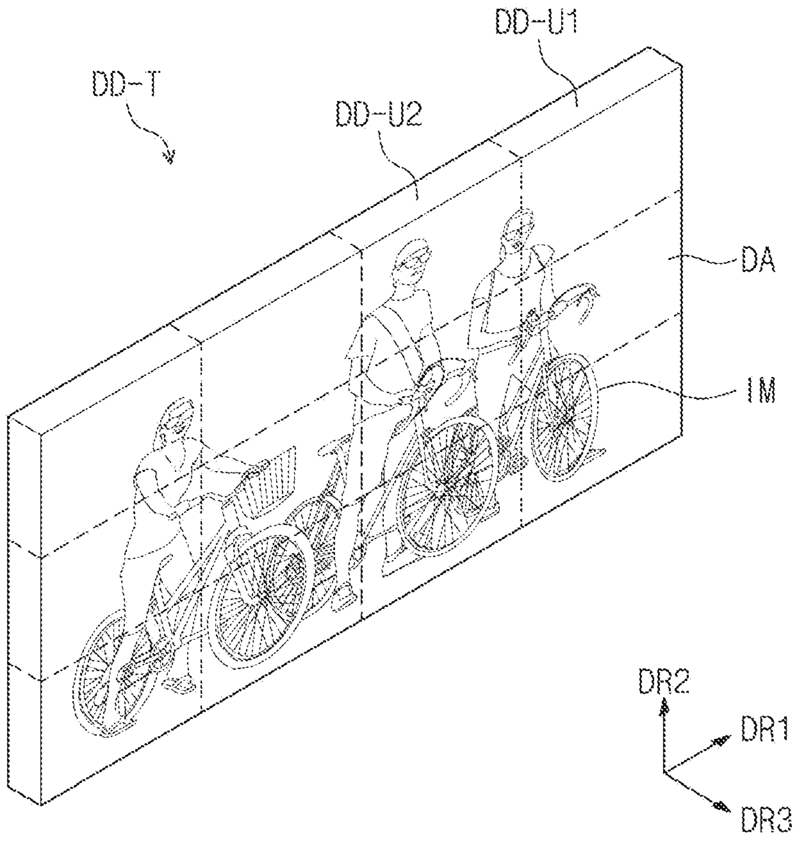
FIG. 6A is a perspective view of a tiling display device according to one or more embodiments of the present disclosure.
Figure 6B:
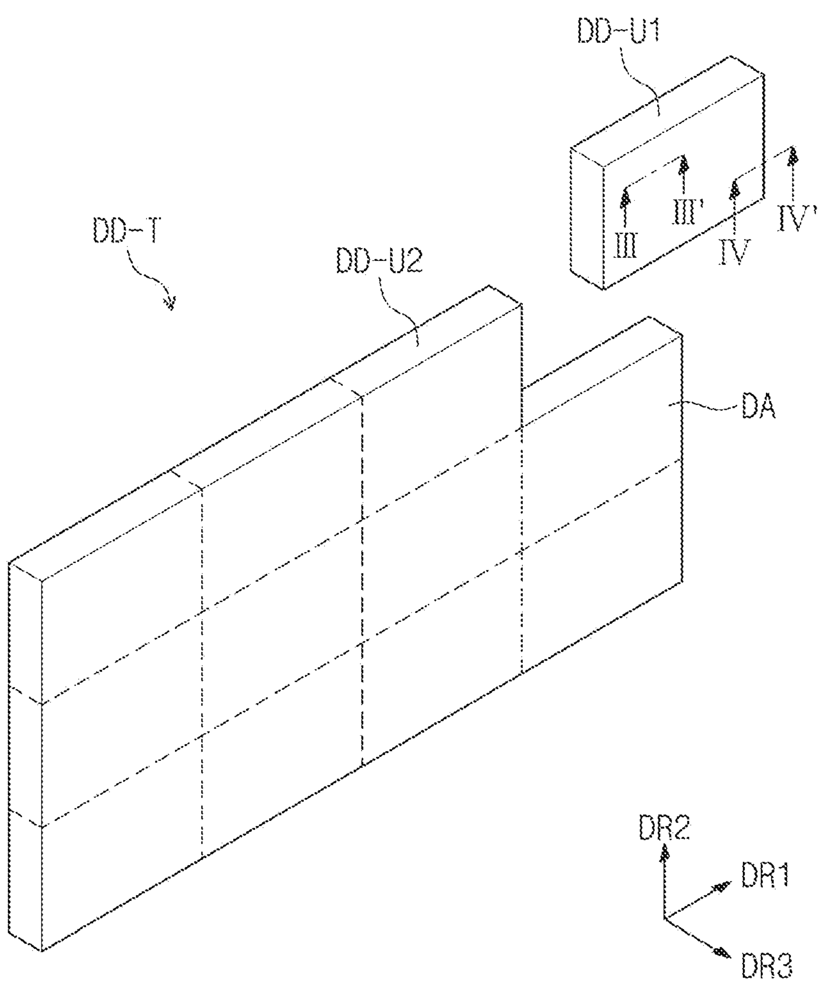
FIG. 6B is a perspective view showing a state in which some components are separated in a tiling display device according to one or more embodiments of the present disclosure.

FIG. 6A is a perspective view of a tiling display device according to one or more embodiments of the present disclosure. FIG. 6B is a perspective view showing a state in which some components are separated in a tiling display device according to one or more embodiments of the present disclosure.

A tiling display device DD-T may be a device activated by an electrical signal. The tiling display device DD-T may include one or more suitable embodiments. The tiling display device DD-T of one or more embodiments may be a tiling display including a plurality of unit display devices DD-U1 and DD-U2. Each of the unit display devices DD-U1 and DD-U2 included in the tiling display device DD-T is not only applicable to a tiling display device due to a reduced tolerance between a display panel and another component, but also reduces a bezel of the tiling display device DD-T even when applied to the tiling display device DD-T alone, so that the aesthetics of a display device may be improved. The description of the display device DD described with reference to FIG. 1 to FIG. 5C may be equally applied to each of the unit display devices DD-U1 and DD-U2.

In the tiling display device DD-T of one or more embodiments, the plurality of unit display devices DD-U1 and DD-U2 may be disposed side by side on a plane. The plurality of unit display devices DD-U1 and DD-U2 may be disposed side by side along the first direction DR1 and the second direction DR2. An edge on one side of each of the plurality of unit display devices DD-U1 and DD-U2 may be in contact with each other. In the tiling display device DD-T of one or more embodiments, the plurality of unit display devices DD-U1 and DD-U2, which are individually provided, may be coupled to each other to display one image IM.

The tiling display device DD-T may include a display region in which the image IM is displayed. The display region in which the image IM is displayed may be parallel to a plane defined by the first direction DR1 and the second direction DR2. The tiling display device DD-T of one or more embodiments may include a display region DA, and may not include (e.g., may exclude) a non-display region. The tiling display device DD-T may have a three-dimensional shape having a predetermined thickness in the third direction DR3.

Figure 7A:
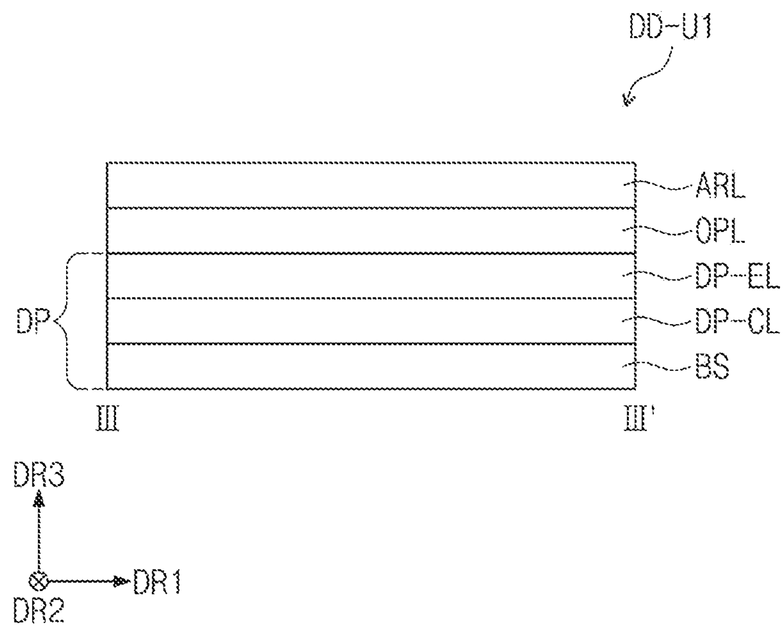
FIGS. 7A-7B are cross-sectional views of a unit display device taken along lines III-III' and IV-IV", respectively, of FIG. 6B, according to one or more embodiments of the present disclosure.
Figure 7B:
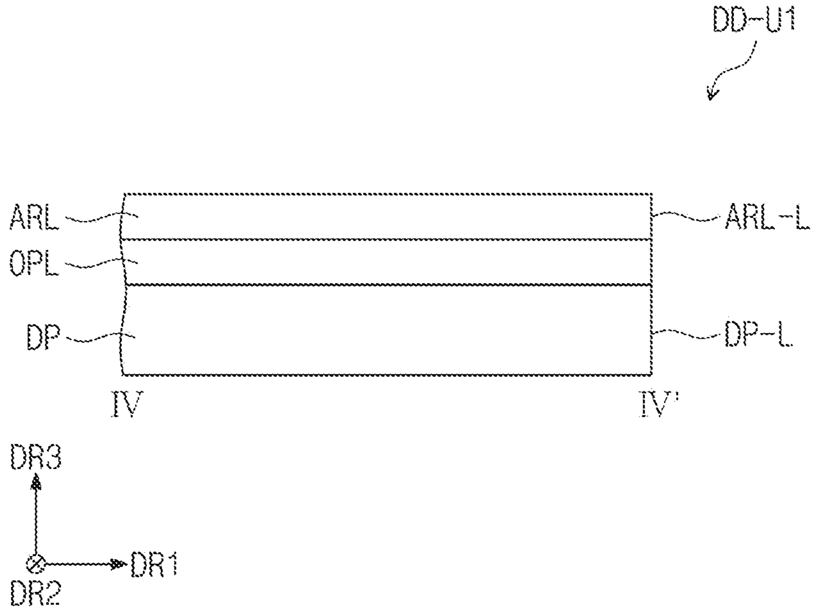

FIG. 7A and FIG. 7B are cross-sectional views of a unit display device according to one or more embodiments of the present disclosure. FIG. 7A is a cross-sectional view taken along line III-III' of FIG. 6B. FIG. 7B is a cross-sectional view taken along line IV-IV' of FIG. 6B.

Referring to FIG. 7A, a unit display device DD-U1 according to one or more embodiments includes an anti-reflection layer ARL, an optical layer OPL, and a display panel DP. The anti-reflection layer ARL may be disposed on the display panel DP. The anti-reflection layer ARL may be directly disposed on the optical layer OPL. For example, the anti-reflection layer ARL is not attached to the optical layer OPL in a separate film form with an adhesive layer, a pressure-sensitive adhesive layer, and/or the like interposed therebetween, but may be a layer directly formed on the optical layer OPL through deposition and/or the like. The contents described with reference to FIG. 1 to FIG. 5C may be equally applied to each of the display panel DP, the optical layer OPL, and the anti-reflection layer ARL.

Referring to FIG. 7B, in the unit display device DD-U1 of one or more embodiments, a side surface ARL-L of the anti-reflection layer ARL and a side surface DP-L of the display panel DP may define one aligned side surface. For example, the side surface ARL-L of the anti-reflection layer ARL and the side surface DP-L of the display panel DP are side by side, and any one thereof may not have a shape protruding along the first direction DR1. In one or more embodiments, a predetermined tolerance may be defined between the side surface ARL-L of the anti-reflection layer ARL and the side surface DP-L of the display panel DP. For example, in the unit display device DD-U1 of one or more embodiments, the side surface ARL-L of the anti-reflection layer ARL and the side surface DP-L of the display panel DP may not be aligned side by side, and any one of the side surface ARL-L of the anti-reflection layer ARL and the side surface DP-L of the display panel DP may have a more protruded shape along the first direction DR1 or the second direction DR2 compared to the other. In a process of manufacturing the unit display device DD-U1, the tolerance may be formed due to a difference in etch rates between the anti-reflection layer ARL and the display panel DP when the anti-reflection layer ARL and the display panel DP are etched through the same (or substantially the same) process.

In one or more embodiments, as illustrated in FIG. 7B, a side surface of the optical layer OPL may be aligned side by side with the side surface DP-L of the display panel DP. However, the present disclosure is not limited thereto, and the side surface of the optical layer OPL may not be side by side with the side surface DP-L of the display panel DP.

In the unit display device DD-U1 of one or more embodiments, the tolerance defined between the side surface ARL-L of the anti-reflection layer ARL and the side surface DP-L of the display panel DP may be about 0 to about 30 μm. For example, when the tolerance defined between the side surface ARL-L of the anti-reflection layer ARL and the side surface DP-L of the display panel DP is 0, it may mean that the side surface ARL-L of the anti-reflection layer ARL and the side surface DP-L of the display panel DP are side by side. In the unit display device DD-U1 of one or more embodiments, because the anti-reflection layer ARL is not provided in a separate film form but is directly formed by being deposited or formed on a component such as the optical layer OPL and/or the like, the tolerance defined between the side surface ARL-L of the anti-reflection layer ARL and the side surface DP-L of the display panel DP may be about 0 to about 30 μm. When the tolerance defined between the side surface ARL-L of the anti-reflection layer ARL and the side surface DP-L of the display panel DP is greater than 30 μm, it may not be possible for the unit display device DD-U1 of one or more embodiments to be applied to the tiling display device DD-T due to a large tolerance. Because a plurality of unit display devices in the tiling display device DD-T are in contact with and coupled to each other to display one image, when the tolerance defined between the side surface ARL-L of the anti-reflection layer ARL and the side surfaces DP-L of the display panel DP is greater than 30 μm, the distance between display regions of respective adjacent unit display devices is increased, so that it may be impossible or not desirable to implement a tiling display device which displays one image.

As described above, in a unit display device including an anti-reflection layer of one or more embodiments, the anti-reflection layer provided on a display panel is not in a film form, but is a layer directly formed on an upper surface of an overcoat layer through deposition and/or the like, so that a tolerance between side surfaces of the anti-reflection layer and of the display panel is reduced compared to an anti-reflection structure provided in a film form, and thus, the unit display device of one or more embodiments may be applied to a tiling display device.

According to one or more embodiments of the present disclosure, a display device of includes a structure in which a first inorganic layer and a second inorganic layer having different refractive indices while each including silicon oxynitride are alternately stacked, and accordingly, it is possible to form an anti-reflection layer structure having low reflectance and high capping properties while being formed through a simple process, so that the display device may have improved durability and visibility.

As used herein, the term “substantially,” “about,” and similar terms are used as terms of approximation and not as terms of degree, and are intended to account for the inherent deviations in measured or calculated values that would be recognized by those of ordinary skill in the art. “Substantially” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “substantially” may mean within one or more standard deviations, or within ±30%, 20%, 10%, 5% of the stated value.

Also, any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of “may” when describing embodiments of the present disclosure refers to “one or more embodiments of the present disclosure.”

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it will be understood by those skilled in the art that one or more suitable changes in form and details may be made therein without departing from the spirit and scope of the present disclosure as set forth in the following claims and equivalents thereof. Accordingly, the technical scope of the present disclosure is not intended to be limited to the contents set forth in the detailed description of the present disclosure, but is intended to be defined by the appended claims and equivalents thereof.

What is claimed is:

1. A display device comprising:

a display panel; and an anti-reflection layer on the display panel, the anti-reflection layer comprising a plurality of inorganic layers comprising:

a plurality of first inorganic layers having a first refractive index, and each comprising a silicon oxynitride (SiON); and a plurality of second inorganic layers having a second refractive index which is higher than the first refractive index, and each comprising a silicon oxynitride, wherein one of the plurality of first inorganic layers is closest to the display panel from among the plurality of first inorganic layers and the plurality of second inorganic layers.

2. The display device of claim 1, wherein:

the first refractive index is about 1.50 to about 1.70 at a wavelength of about 550 nm; and the second refractive index is about 1.70 to about 1.90 at the wavelength of about 550 nm.

3. The display device of claim 1, wherein the plurality of first inorganic layers and the plurality of second inorganic layers are alternately stacked.

4. The display device of claim 3, wherein:

the plurality of first inorganic layers comprise a 1-1 inorganic layer and a 1-2 inorganic layer; and the plurality of second inorganic layers comprise a 2-1 inorganic layer and a 2-2 inorganic layer, wherein the 1-1 inorganic layer, the 2-1 inorganic layer, the 1-2 inorganic layer, and the 2-2 inorganic layer are sequentially stacked.

5. The display device of claim 1, wherein a thickness of each of the plurality of first inorganic layers and the plurality of second inorganic layers is about 10 nm to about 150 nm.

6. The display device of claim 1, wherein when an amount of oxygen with respect to a total amount of elements in the plurality of first inorganic layers is defined as a first oxygen content, and an amount of oxygen with respect to a total amount of elements in the plurality of second inorganic layers is defined as a second oxygen content, the first oxygen content is greater than the second oxygen content.

7. The display device of claim 1, wherein when an amount of nitrogen with respect to a total amount of elements in the plurality of first inorganic layers is defined as a first nitrogen content, and an amount of nitrogen with respect to a total amount of elements in the plurality of second inorganic layers is defined as a second nitrogen content, the first nitrogen content is less than the second nitrogen content.

8. The display device of claim 1, wherein:

each of the plurality of first inorganic layers comprises about 23 at % to about 26 at % of oxygen, about 31 at % to about 34 at % of nitrogen, and about 41 at % to about 44 at % of silicon with respect to a total amount of each of the plurality of first inorganic layers; and each of the plurality of second inorganic layers comprises about 20 at % to about 23 at % of oxygen, about 35 at % to about 38 at % of nitrogen, and about 39 at % to about 42 at % of silicon with respect to a total amount of each of the plurality of second inorganic layers.

9. The display device of claim 1, further comprising an optical layer between the display panel and the anti-reflection layer, wherein the optical layer comprises:

a light control layer on the display panel; and a color filter layer between the light control layer and the anti-reflection layer.

10. The display device of claim 9, wherein the display panel comprises a plurality of light emitting elements generating a first light, and wherein the light control layer comprises:

a first light control unit configured to transmit the first light;

a second light control unit configured to convert the first light into a second light having a different wavelength from the first light; and a third light control unit configured to convert the first light into a third light having a different wavelength from the first light and the second light.

11. The display device of claim 9, wherein the optical layer further comprises an overcoat layer on the color filter layer, wherein the anti-reflection layer is in contact with an upper surface of the overcoat layer.

12. The display device of claim 11, wherein:

a refractive index of the overcoat layer is about 1.45 to about 1.53; and a thickness of the overcoat layer is about 3 μm to about 10 μm.

13. The display device of claim 1, wherein the anti-reflection layer further comprises a low refractive layer on the plurality of inorganic layers, wherein an upper surface of the low refractive layer defines an outermost periphery surface of the anti-reflection layer.

14. The display device of claim 13, wherein a refractive index of the low refractive layer is about 1.3 to less than about 1.5.

15. The display device of claim 1, wherein reflectance on an upper surface of the anti-reflection layer is about 2% or less.

16. A display device comprising:

a display panel; and an anti-reflection layer on the display panel, the anti-reflection layer comprising a plurality of inorganic layers comprising:

a plurality of first inorganic layers, each comprising a silicon oxynitride (SiON); and a plurality of second inorganic layers, each comprising a silicon oxynitride, wherein, when an amount of oxygen with respect to a total amount of elements in the plurality of first inorganic layers is defined as a first oxygen content, and an amount of oxygen with respect to a total amount of elements in the plurality of second inorganic layers is defined as a second oxygen content, the first oxygen content is greater than the second oxygen content, and wherein one of the plurality of first inorganic layers is closest to the display panel from among the plurality of first inorganic layers and the plurality of second inorganic layers.

17. The display device of claim 16, wherein when an amount of nitrogen with respect to the total amount of elements in the plurality of first inorganic layers is defined as a first nitrogen content, and an amount of nitrogen with respect to the total amount of elements in the plurality of second inorganic layers is defined as a second nitrogen content, the first nitrogen content is less than the second nitrogen content.

18. The display device of claim 16, further comprising an optical layer between the display panel and the anti-reflection layer, wherein the optical layer comprising:

a light control layer on the display panel;

a color filter layer between the light control layer and the anti-reflection layer; and an overcoat layer on the color filter layer, wherein the anti-reflection layer is directly on the overcoat layer.

19. A tiling display device comprising a plurality of unit display devices along at least one direction, wherein each of the plurality of unit display devices comprises:

a display panel; and an anti-reflection layer on the display panel, the anti-reflection layer comprising a plurality of inorganic layers comprising:

a first inorganic layer having a first refractive index, and comprising a silicon oxynitride (SiON); and a second inorganic layer being in contact with any one of an upper surface or a lower surface of the first inorganic layer, and having a second refractive index which is higher than the first refractive index, and comprising a silicon oxynitride, wherein the first inorganic layer is closest to the display panel relative to the second inorganic layer.

20. The tiling display device of claim 19, wherein a side surface of the anti-reflection layer and a side surface of the display panel define one aligned side surface.

* * * * *